United States Patent
Sugiura et al.

(10) Patent No.: US 10,580,953 B2
(45) Date of Patent: Mar. 3, 2020

(54) THERMOELECTRIC CONVERSION ELEMENT, THERMOELECTRIC CONVERSION MODULE, METHOD FOR MANUFACTURING THERMOELECTRIC CONVERSION ELEMENT, AND METHOD FOR MANUFACTURING THERMOELECTRIC CONVERSION MODULE

(71) Applicant: FUJIFILM Corporation, Tokyo (JP)

(72) Inventors: Hiroki Sugiura, Ashigara-kami-gun (JP); Yuzo Nagata, Ashigara-kami-gun (JP); Kimiatsu Nomura, Ashigara-kami-gun (JP); Toshiaki Aoai, Ashigara-kami-gun (JP)

(73) Assignee: FUJIFILM Corporation, Tokyo (JP)

(*) Notice: Subject to any disclaimer, the term of this patent is extended or adjusted under 35 U.S.C. 154(b) by 365 days.

(21) Appl. No.: 15/449,032

(22) Filed: Mar. 3, 2017

(65) Prior Publication Data
US 2017/0179361 A1   Jun. 22, 2017

Related U.S. Application Data

(63) Continuation of application No. PCT/JP2015/070023, filed on Jul. 13, 2015.

(30) Foreign Application Priority Data

Sep. 5, 2014 (JP) ................................. 2014-181164
Mar. 30, 2015 (JP) ................................. 2015-069753

(51) Int. Cl.
*H01L 35/24* (2006.01)
*H01L 35/26* (2006.01)
(Continued)

(52) U.S. Cl.
CPC .............. *H01L 35/22* (2013.01); *B82Y 40/00* (2013.01); *H01L 35/24* (2013.01); *H01L 35/26* (2013.01);
(Continued)

(58) Field of Classification Search
CPC ......... H01L 35/02; H01L 35/26; H01L 35/32; B82Y 30/00; Y10S 977/742; Y10S 977/948
See application file for complete search history.

(56) References Cited

U.S. PATENT DOCUMENTS

2010/0218979 A1  9/2010  Chang et al.
2011/0111202 A1  5/2011  Su et al.
(Continued)

FOREIGN PATENT DOCUMENTS

JP    3981738 B2    9/2007
JP    2008-24523 A   2/2008
(Continued)

OTHER PUBLICATIONS

English translation of the International Preliminary Report on Patentability (Forms PCT/IB/338 and PCT/IPEA/409), dated Mar. 9, 2017, for International Application No, PCT/JP2015/070023.
(Continued)

*Primary Examiner* — Susan D Leong
(74) *Attorney, Agent, or Firm* — Birch, Stewart, Kolasch & Birch, LLP

(57) ABSTRACT

A thermoelectric conversion layer contains carbon nanotubes and a surfactant, and in an upper portion and a lower portion and/or a side face end surface and a center, a mass ratio obtained by dividing the carbon nanotubes by the surfactant is higher in the upper portion and/or the end surface than in the other portions. A layer which contains carbon nanotubes and a surfactant and will become a ther-
(Continued)

moelectric conversion element is formed, the layer is washed with a washing agent which dissolves the surfactant but does not dissolve the carbon nanotubes. Accordingly, provided is a thermoelectric conversion element and a thermoelectric conversion module, each having not only high adhesiveness between the substrate and the thermoelectric conversion layer but also excellent thermoelectric conversion performance; and methods for manufacturing the thermoelectric conversion element and the thermoelectric conversion module.

9 Claims, 6 Drawing Sheets

(51) Int. Cl.
  *H01L 35/22* (2006.01)
  *H01L 35/32* (2006.01)
  *H01L 35/34* (2006.01)
  *B82Y 40/00* (2011.01)
  *B82Y 30/00* (2011.01)

(52) U.S. Cl.
  CPC .............. *H01L 35/32* (2013.01); *H01L 35/34* (2013.01); *B82Y 30/00* (2013.01); *Y10S 977/742* (2013.01); *Y10S 977/842* (2013.01); *Y10S 977/892* (2013.01); *Y10S 977/948* (2013.01)

(56) References Cited

U.S. PATENT DOCUMENTS

| 2013/0333738 A1 | 12/2013 | Suemori et al. |
| 2014/0205919 A1 | 7/2014 | Wilde et al. |

FOREIGN PATENT DOCUMENTS

| JP | 2008-195563 A | 8/2008 |
| JP | 2009-64925 A | 3/2009 |
| JP | 2011-504280 A | 2/2011 |
| JP | 2012-222244 A | 11/2012 |
| JP | 2014-44839 A | 3/2014 |
| WO | WO 2012/121133 A1 | 9/2012 |
| WO | WO 2013/121486 A1 | 8/2013 |

OTHER PUBLICATIONS

Japanese Office Action issued in Japanese Application No. 2016-546373, dated Jul. 18, 2017, together with an English translation.
International Preliminary Report on Patentability for PCT/JP2015/070023 (PCT/IPEA/409) dated Jun. 6, 2016.
International Search Report for PCT/JP2015/070023 (PCT/ISA/210) dated Oct. 6, 2015.
Written Opinion of the International Searching Authority for PCT/2015/070023 (PCT/ISA/237) dated Oct. 6, 2015.

THERMOELECTRIC CONVERSION ELEMENT, THERMOELECTRIC CONVERSION MODULE, METHOD FOR MANUFACTURING THERMOELECTRIC CONVERSION ELEMENT, AND METHOD FOR MANUFACTURING THERMOELECTRIC CONVERSION MODULE

CROSS-REFERENCE TO RELATED APPLICATIONS

This application is a Continuation of PCT International Application No. PCT/JP2015/070023 filed on Jul. 13, 2015, which claims priority under 35 U.S.C. § 119(a) to Japanese Patent Application No. 2014-181164 filed on Sep. 5, 2014 and Japanese Patent Application No. 2015-069753 filed on Mar. 30, 2015. Each of the above applications is hereby expressly incorporated by reference, in its entirety, into the present application.

BACKGROUND OF THE INVENTION

1. Field of the Invention

The present invention relates to a thermoelectric conversion element and a thermoelectric conversion module. Specifically, the present invention relates to a thermoelectric conversion element and a thermoelectric conversion module, which have excellent mechanical strength and thermoelectric conversion performance, and to methods for manufacturing the thermoelectric conversion element and the thermoelectric conversion module.

2. Description of the Related Art

Thermoelectric conversion materials that enable the interconversion between heat energy and electric energy are used in a thermoelectric conversion element such as a power generating element for thermally generating electric power or a Peltier element.

The thermoelectric conversion element can directly convert heat energy into electric power and thus has an advantage of not requiring a moving part. Therefore, by providing a power generating device using the thermoelectric conversion element in a heat exhaust site such as an incinerator or various factory facilities, it is possible to obtain electric power in a simple manner without needing to incur operational costs.

Regarding the thermoelectric conversion element, as a thermoelectric conversion material demonstrating excellent thermoelectric conversion performance, a carbon nanotube is known. In the following description, the carbon nanotube will be referred to as CNT as well.

For example, WO2012/121133A describes a thermoelectric conversion material which is formed of holes and a flexible organic material containing dispersed fine CNT particles and in which a mass ratio of CNT with respect to the organic material is 50% to 90% by mass.

Furthermore, WO02012/121133A describes a thermoelectric conversion module including a plurality of thermoelectric conversion elements in which the thermoelectric conversion material is used as a thermoelectric conversion layer and the thermoelectric conversion layer is interposed between electrodes that come into contact with the upper and lower portions of the thermoelectric conversion layer. In the thermoelectric conversion module, the plurality of thermoelectric conversion elements is arranged on a film substrate, and the upper electrode of a thermoelectric conversion element is connected to the lower electrode of an adjacent thermoelectric conversion element such that the plurality of thermoelectric conversion elements is connected to each other in series.

Incidentally, as described in WO2012/121133A, the thermoelectric conversion element is generally constituted with an electrode disposed on a plate-like substrate, a block-like thermoelectric conversion layer (power generating layer) disposed on the electrode, and a plate-like electrode disposed on the thermoelectric conversion layer. The thermoelectric conversion element having such a configuration is also called uni leg-type thermoelectric conversion element.

That is, in a general thermoelectric conversion element, the thermoelectric conversion layer is interposed between the electrodes in a thickness direction, and a temperature difference is caused in the thickness direction of the thermoelectric conversion layer, thereby converting heat energy into electric energy.

In contrast, JP3981738B describes a thermoelectric conversion element using a substrate having a high thermal conduction portion, in which heat energy is converted into electric energy by causing a temperature difference in the plane direction of a thermoelectric conversion layer, not in the thickness direction of the thermoelectric conversion layer.

Specifically, JP3981738B describes a thermoelectric conversion element having a constitution in which a flexible film substrate constituted with two kinds of materials having different thermal conductivities is disposed on both surfaces of a thermoelectric conversion layer formed of a P-type material and an N-type material, and the materials having different thermal conductivities are positioned on the outer surface of the substrate and in a direction perpendicular to a direction along which electricity is conducted.

SUMMARY OF THE INVENTION

The thermoelectric conversion element generates electric power by causing a temperature difference in a direction along which the electrodes connected to the thermoelectric conversion layer are separated from each other, and a higher power generation capacity can be obtained as the temperature difference becomes great.

Accordingly, in the general thermoelectric conversion element having a constitution in which the thermoelectric conversion layer is interposed between electrodes as shown in WO2012/121133A, in order to cause a great temperature difference in the thermoelectric conversion layer, the thermoelectric conversion layer needs to be thickened in a direction along which it is interposed between the electrodes.

In contrast, the thermoelectric conversion element described in JP3981738B converts heat energy into electric energy by causing a temperature difference in the plane direction of the thermoelectric conversion layer by using the high thermal conduction portion provided on the substrate.

Therefore, even if the thermoelectric conversion layer is in the form of a thin sheet, by lengthening the thermoelectric conversion layer, it is possible to cause a great temperature difference and to obtain a high power generation capacity. Furthermore, because the thermoelectric conversion layer can be made into a sheet, the thermoelectric conversion element has excellent flexibility, and a thermoelectric conversion module that can be easily installed on a curved surface or the like is obtained.

However, for realizing a thermoelectric conversion module having a high power generation capacity and excellent flexibility by using the thermoelectric conversion element described in JP3981738B, not only high thermoelectric conversion performance but also high adhesiveness between the substrate such as a plastic film, on which the thermoelectric conversion layer is formed, and the thermoelectric conversion layer are required.

Unfortunately, regarding the thermoelectric conversion element in which CNT demonstrating excellent thermoelectric conversion performance is used as a thermoelectric conversion material, a thermoelectric conversion element satisfying both the high thermoelectric conversion performance and the high adhesiveness between the substrate and the thermoelectric conversion layer has not yet been realized.

Objects of the present invention are to provide a thermoelectric conversion element which uses carbon nanotubes as a thermoelectric conversion material, includes a thermoelectric conversion layer formed on the surface of a substrate, has high thermoelectric conversion performance, and is excellent in the adhesiveness between the substrate and the thermoelectric conversion layer, to provide a thermoelectric conversion module using the thermoelectric conversion element, and to provide methods for manufacturing the thermoelectric conversion element and the thermoelectric conversion module.

In order to achieve the objects, in the present invention, there is provided a thermoelectric conversion element comprising:

a first substrate;

a thermoelectric conversion layer which contains carbon nanotubes and a surfactant and is formed on the surface of the first substrate; and an electrode pair disposed along the plane direction of the first substrate such that the thermoelectric conversion layer is interposed between the electrode pair, wherein the surface, on which the thermoelectric conversion layer is formed, of the first substrate has a surface energy of equal to or greater than 20 mN/m, and provided that a region which occupies 50% of the film thickness of the thermoelectric conversion layer on the first substrate side in the thickness direction of the thermoelectric conversion layer is a lower layer portion, a region other than the lower layer portion in the thickness direction of the thermoelectric conversion layer is an upper layer portion, a region which occupies 20% of the end portion side of the thermoelectric conversion layer in the substrate plane direction of the first substrate is an end region, and a region other than the end region in the substrate plane direction of the first substrate is a central region, a mass ratio, which is obtained by dividing the mass of the carbon nanotubes by the mass of the surfactant, satisfies at least one of "upper layer portion>lower layer portion" or "end region>central region" in the thermoelectric conversion layer.

The thermoelectric conversion element of the present invention preferably further comprises: a pressure sensitive adhesive layer on the thermoelectric conversion layer; and a second substrate on the pressure sensitive adhesive layer.

It is preferable that the first substrate has a high thermal conduction portion, which has higher thermal conductivity compared to other regions, in at least a portion in the plane direction, the second substrate has a high thermal conduction portion, which has higher thermal conductivity compared to other regions, in at least a portion in the plane direction, the high thermal conduction portion of the second substrate does not completely overlap the high thermal conduction portion of the first substrate in the plane direction.

It is preferable that the thermoelectric conversion layer has a thickness of equal to or greater than 1 μm.

In addition, it is preferable that the surfactant is an ionic surfactant.

The thermoelectric conversion element preferably further comprises a rheological modifier contained in the thermoelectric conversion layer.

It is preferable that the rheological modifier has a redox potential of equal to or greater than −0.1 V with respect to a saturated calomel reference electrode.

Furthermore, in the present invention, there is provided a thermoelectric conversion module comprising a plurality of the thermoelectric conversion elements of the present invention.

In the thermoelectric conversion module of the present invention, it is preferable that a plurality of the thermoelectric conversion layers is regularly arranged on the first substrate and connected to each other through electrodes which become the electrode pair.

In the present invention, as a first aspect, there is provided a method for manufacturing a thermoelectric conversion element of the present invention, comprising: a step of forming an unwashed thermoelectric conversion layer on the surface of a first substrate by using a composition containing carbon nanotubes and a surfactant; a step of forming a thermoelectric conversion layer by washing the unwashed thermoelectric conversion layer with a washing agent which dissolves the surfactant but does not dissolve the carbon nanotubes; and a step of forming an electrode pair such that the thermoelectric conversion layer is interposed between the electrode pair in the plane direction of the first substrate.

In the present invention, as a second aspect, there is provided a method for manufacturing a thermoelectric conversion element of the present invention, comprising: a step of forming electrodes on the surface of a first substrate; a step of forming an unwashed thermoelectric conversion layer on the first substrate having the electrodes formed thereon by using a composition containing carbon nanotubes and a surfactant, such that the unwashed thermoelectric conversion layer covers the electrodes; and a step of forming a thermoelectric conversion layer by washing the unwashed thermoelectric conversion layer with a washing agent which dissolves the surfactant but does not dissolve the carbon nanotubes.

In the method for manufacturing a thermoelectric conversion element of the present invention, it is preferable that the washing agent has a C Log P value of −1.4 to 1.

It is preferable that the composition containing carbon nanotubes and a surfactant further contains water and a rheological modifier, and the content of the rheological modifier is 0.01% to 10% by mass with respect to the water.

It is preferable that a mass ratio of surfactant/carbon nanotubes in the composition and unwashed thermoelectric conversion layer is 1 to 10.

In the present invention, there is provided a method for manufacturing a thermoelectric conversion module, in which a plurality of thermoelectric conversion elements connected to each other is prepared by the method for manufacturing a thermoelectric conversion element according to the present invention.

In the thermoelectric conversion element and the thermoelectric conversion module of the present invention described above, the thermoelectric conversion layer using the carbon nanotubes as the thermoelectric conversion material contains a surfactant, and the surfactant has a concentration distribution. Therefore, the thermoelectric conversion element and the thermoelectric conversion module have high thermoelectric conversion performance and are excellent in the adhesiveness between the thermoelectric conversion layer and the substrate.

Furthermore, according to the manufacturing methods of the present invention, such excellent thermoelectric conversion element and thermoelectric conversion module can be stably manufactured.

DESCRIPTION OF THE PREFERRED EMBODIMENTS

Hereinafter, a thermoelectric conversion element, a thermoelectric conversion module, a method for manufacturing a thermoelectric conversion element, and a method for manufacturing a thermoelectric conversion module of the present invention will be specifically described based on preferred examples illustrated in the attached drawings.

Figure 1A:
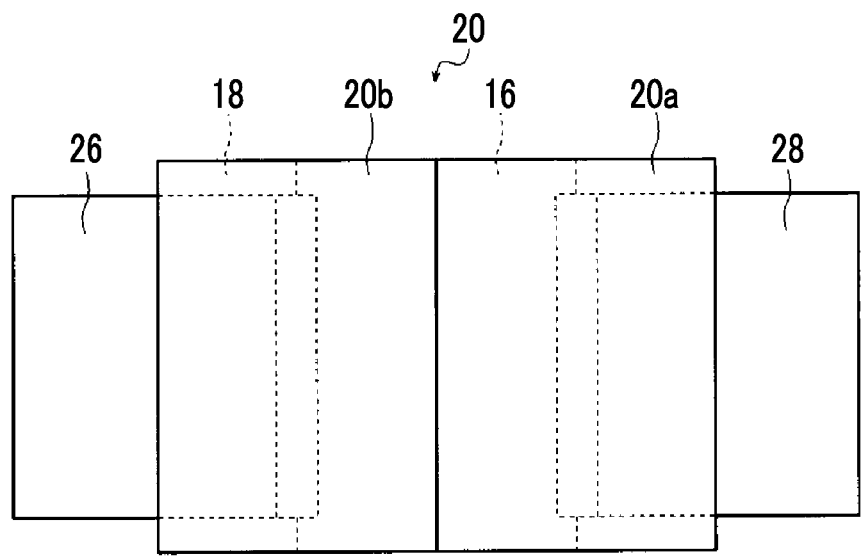
FIG. 1A is a top view schematically showing an example of a thermoelectric conversion element of the present invention.
Figure 1B:
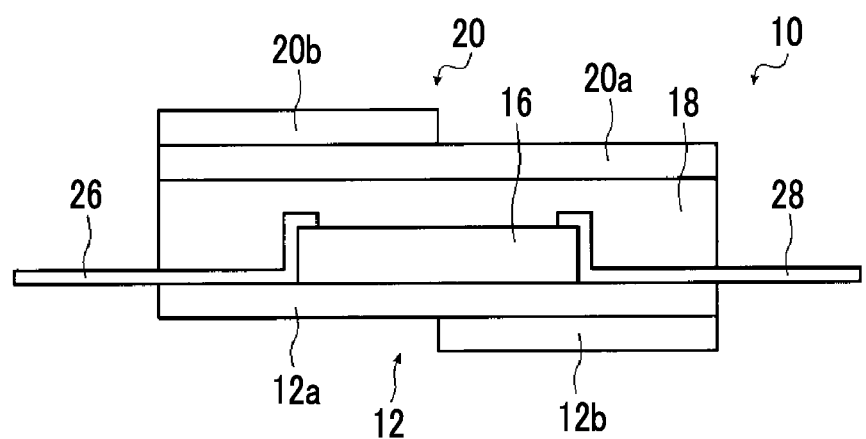
FIG. 1B is a front view schematically showing an example of the thermoelectric conversion element of the present invention.
Figure 1C:
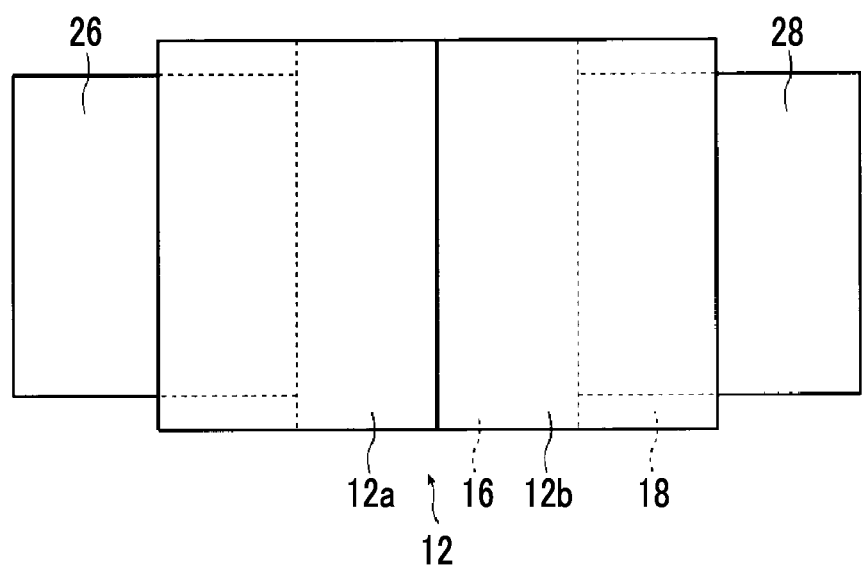
FIG. 1C is a bottom view schematically showing an example of the thermoelectric conversion element of the present invention.

FIGS. 1A to 1C schematically show an example of the thermoelectric conversion element of the present invention. FIG. 1A is a top view and is a view obtained by viewing FIG. 1B from the upper side of paper. FIG. 1B is a front view and is a view obtained by viewing the thermoelectric conversion element from the plane direction of the substrate or the like which will be described later. FIG. 1C is a bottom view and is a view obtained by viewing FIG. 1B from the lower side of paper.

As shown in FIGS. 1A to 1C, a thermoelectric conversion element 10 is basically constituted with a first substrate 12, a thermoelectric conversion layer 16, a pressure sensitive adhesive layer 18, a second substrate 20, a first electrode 26, and a second electrode 28.

Specifically, the thermoelectric conversion layer 16 is formed on the surface of the first substrate 12. On the surface of the first substrate 12, the first electrode 26 and the second electrode 28 connected to the thermoelectric conversion layer 16 are formed such that the thermoelectric conversion layer 16 is interposed between the electrodes in the substrate plane direction of the first substrate 12. The first electrode 26 and the second electrode 28 constitute an electrode pair. Furthermore, the pressure sensitive adhesive layer 18 is provided so as to cover the first substrate 12, the thermoelectric conversion layer 16, the first electrode 26, and the second electrode 28, and the second substrate 20 is stuck to the pressure sensitive adhesive layer 18.

In the following description, the substrate plane direction is simply referred to as a plane direction as well.

As shown in FIGS. 1A to 1C, the first substrate 12 has a low thermal conduction portion 12a and a high thermal conduction portion 12b. Similarly, the second substrate 20 has a low thermal conduction portion 20a and a high thermal conduction portion 20b. In the example illustrated in the drawing, both of the substrates are arranged such that the high thermal conduction portions thereof are in different positions in a direction along which the first electrode 26 and the second electrode 28 are separated from each other. That is, the direction along which the first electrode 26 and the second electrode 28 are separated from each other is an electricity conduction direction.

In a preferred embodiment, the thermoelectric conversion element 10 has the second substrate 20 stuck by the pressure sensitive adhesive layer 18, and the first substrate 12 and the second substrate 20 both have the low thermal conduction portion and the high thermal conduction portion. The thermoelectric conversion element 10 has a constitution in which two sheets of substrates having the high thermal conduction portion and the low thermal conduction portion are used, and the thermoelectric conversion layer is interposed between the two sheets of substrates such that the high thermal conduction portions of both of the substrates are in different positions in the plane direction. As a result, by more preferably causing a great temperature difference in the plane direction of the thermoelectric conversion layer 16, heat energy can be converted into electric energy, and high power generation capacity can be obtained.

In the following description, such a constitution of the thermoelectric conversion element 10, in which two sheets of substrates having the high thermal conduction portion and the low thermal conduction portion are used, and the thermoelectric conversion layer is interposed between the two sheets of substrates such that the high thermal conduction portions of both of the substrates are in different positions in the plane direction, is referred to as an in plane type as well.

The first substrate 12 and the second substrate 20 have the same constitution except for the arrangement position and the orientation of the front and rear or the plane direction (substrate plane direction). Therefore, in the following description, except for a case where the first substrate 12 and the second substrate 20 need to be differentiated from each other, the first substrate 12 will be illustrated as a representative example.

In the thermoelectric conversion element 10 illustrated in the drawing, the first substrate 12 (second substrate 20) has a constitution in which the high thermal conduction portion 12b (high thermal conduction portion 20b) is laminated so as to cover half of the region of one surface of a plate-like substance that will become the low thermal conduction portion 12a (low thermal conduction portion 20a).

Accordingly, half of the region of one surface of the first substrate 12 in the plane direction becomes the low thermal conduction portion 12a, and the other half of the region becomes the high thermal conduction portion 12b.

The entirety of the other surface of the first substrate 12 becomes the low thermal conduction portion 12a. In the thermoelectric conversion element 10, the surface, on which the high thermal conduction portion 12b is not formed, of the low thermal conduction portion 12a of the first substrate 12 becomes a surface on which the thermoelectric conversion layer 16 is formed.

In the thermoelectric conversion element of the present invention, the first substrate 12 (second substrate 20) can adopt various constitutions in addition to the constitution in which the high thermal conduction portion is laminated on the surface of the low thermal conduction portion. For example, as schematically shown in FIG. 4A, the first substrate may have a constitution in which a concave portion is formed in half of the region of one surface of a plate-like substance that will become the low thermal conduction portion 12a, and the high thermal conduction portion 12b is incorporated into the concave portion so as to form a uniform surface.

Figure 4A:
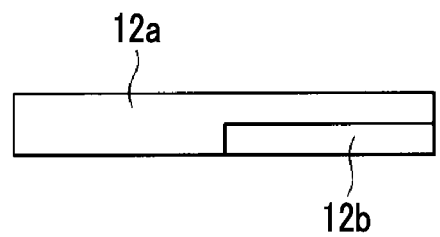
FIG. 4A is a schematic view showing another example of a substrate used in the thermoelectric conversion element of the present invention.

Furthermore, the first substrate 12 may be constituted with the laminate shown in FIG. 1A, and the second substrate 20 may have a constitution in which the high thermal conduction portion is incorporated into the concave portion shown in FIG. 4A. In this way, the method for forming the high thermal conduction portion may vary between the first substrate and the second substrate.

As the low thermal conduction portion 12a, substances composed of various materials, such as a glass plate, a ceramic plate, and a film composed of a resin material (polymer material) such as a plastic film, can be used as long as the substances have insulating properties and exhibit sufficient heat resistance at the time of forming the thermoelectric conversion layer 16, the first electrode 26, and the like.

As the low thermal conduction portion 12a, a film composed of a resin material is preferably used. It is preferable to use a film (sheet-like substance/plate-like substance) composed of a resin material as the low thermal conduction portion 12a, because then the weight reduction and cost reduction can be achieved, and the flexible thermoelectric conversion element 10 can be formed.

Specific examples of the resin material which can be used in the low thermal conduction portion 12a include a polyester resin such as polyethylene terephthalate, polyethylene isophthalate, polyethylene naphthalate, polubutylene terephthalate, poly(1,4-cyclohexylenedimethylene-terephthalate), or polyethylene-2,6-phthalenedicarboxylate; a resin such as polyimide, polycarbonate, polypropylene, polyether sulfone, a cycloolefin polymer, polyether ether ketone (PEEK), or triacetyl cellulose (TAC); glass epoxy; liquid crystal polyester; and the like.

Among these, in view of thermal conductivity, heat resistance, solvent resistance, ease of availability, economic efficiency, and the like, a film composed of polyimide, polyethylene terephthalate, polyethylene naphthalate, or the like is preferably used.

As the high thermal conduction portion 12b, for example, films composed of various materials or metal foil can be used as long as the thermal conductivity thereof is higher than that of the low thermal conduction portion 12a.

Specifically, in view of thermal conductivity and the like, for example, various metals such as gold, silver, copper, and aluminum can be used. Among these, in view of thermal conductivity, economic efficiency, and the like, copper and aluminum are preferably used.

In the present invention, the thickness of the first substrate 12, the thickness of the low thermal conduction portion 12a, the thickness of the high thermal conduction portion 12b, and the like should be appropriately set according to the materials forming the high thermal conduction portion 12b and the low thermal conduction portion 12a, the size of the thermoelectric conversion element 10, and the like. Herein, the thickness of the first substrate 12 is a thickness of the low thermal conduction portion 12a in a region free of the high thermal conduction portion 12b. According to the investigation performed by the inventors of the present invention, the thickness of the first substrate 12 is preferably 2 to 100 μm and more preferably 2 to 50 μm.

Furthermore, the size of the first substrate 12 in the plane direction, a proportion of the area of the high thermal conduction portion 12b within the first substrate 12 in the plane direction, and the like should be appropriately set according to the materials forming the low thermal conduction portion 12a and the high thermal conduction portion 12b, the size of the thermoelectric conversion element 10, and the like. That is, the size of the first substrate 12 in the plane direction is a size at the time when the first substrate 12 is seen in a direction orthogonal to the substrate plane.

Moreover, the position of the high thermal conduction portion 12b in the plane direction within the first substrate 12 is not limited to the example illustrated in the drawing, and various positions can be adopted.

For example, within the first substrate 12, the high thermal conduction portion 12b may be included in the low thermal conduction portion 12a in the plane direction. Alternatively, a portion of the high thermal conduction portion 12b may be positioned at the end of the first substrate 12 in the plane direction, and the region other than the aforementioned portion may be included in the low thermal conduction portion 12a.

In addition, the first substrate 12 may have a plurality of high thermal conduction portions 12b in the plane direction.

In the thermoelectric conversion element 10 shown in FIGS. 1A to 1C, as a preferred embodiment in which a temperature difference easily occurs between the first substrate 12 and the second substrate 20, the high thermal conduction portion 12b and the high thermal conduction portion 20b of the first substrate 12 and the second substrate 20 are both positioned outside the lamination direction.

In addition, the present invention may have a constitution in which the high thermal conduction portion 12b and the high thermal conduction portion 20b of the first substrate 12 and the second substrate 20 are both positioned inside the lamination direction. Alternatively, the present invention may have a constitution in which the high thermal conduction portion 12b of the first substrate 12 is positioned outside the lamination direction, and the high thermal conduction portion 20b of the second substrate 20 is positioned inside the lamination direction.

In the constitution in which the high thermal conduction portion is formed of a conductive material such as a metal and is positioned inside the lamination direction, in a case where the high thermal conduction portion is electrically connected to at least one of the first electrode 26, the second electrode 28, or the thermoelectric conversion layer 16, an insulating layer may be provided between the high thermal conduction portion and at least one of the first electrode 26, the second electrode 28, or the thermoelectric conversion layer 16 such that insulating properties between the high thermal conduction portion and at least one of the aforementioned members are secured.

In the thermoelectric conversion element 10, the thermoelectric conversion layer 16 is formed on the surface of the first substrate 12. Specifically, the thermoelectric conversion layer 16 is formed on a surface, on which the high thermal conduction portion 12b is not formed, of the low thermal conduction portion 12a.

Herein, in the thermoelectric conversion element 10 of the present invention, the surface energy of the surface, on which the thermoelectric conversion layer 16 is formed, of the first substrate 12 is preferably equal to or greater than 20 mN/m and more preferably equal to or greater than 25 mN/m. That is, in the example illustrated in the drawing, the surface, on which the high thermal conduction portion 12b is not formed, of the low thermal conduction portion 12a of the first substrate 12 preferably has a surface energy of equal to or greater than 20 mN/m.

It is preferable that the surface energy of the surface, on which the thermoelectric conversion layer 16 is formed, of the first substrate 12 is equal to or greater than 20 mN/m, because then the adhesiveness between the first substrate 12 and the thermoelectric conversion layer 16 can be further improved, and printing properties at the time of forming the thermoelectric conversion layer 16 by printing can be further improved.

On the thermoelectric conversion layer 16, the second substrate 20 is provided via the pressure sensitive adhesive layer 18. The second substrate 20 is provided in a state where the surface, on which the high thermal conduction portion 20b is not formed, of the low thermal conduction portion 20a faces the thermoelectric conversion layer 16.

The high thermal conduction portions 12b and 20b of both substrates are disposed such that a temperature difference can efficiently occur in the plane direction of the thermoelectric conversion layer 16. That is, it is preferable that the high thermal conduction portions 12b and 20b of both substrates are disposed such that they deviate from each other in the plane direction across the thermoelectric conversion layer 16. It is more preferable that the high thermal conduction portions 12b and 20b are disposed such that the boundary between the low thermal conduction portion and the high thermal conduction portion of each substrate coincides with the center of the thermoelectric conversion layer 16 in the plane direction. In both substrates, the high thermal conduction portions are provided so as to cover half of the low thermal conduction portions, that is, half of the substrate surfaces.

Furthermore, an electrode pair consisting of the first electrode 26 and the second electrode 28 is connected to the thermoelectric conversion layer 16 such that the thermoelectric conversion layer 16 is interposed between the electrodes in the plane direction.

In the thermoelectric conversion element, for example, due to heating that occurs by the contact with a heat source and the like, a temperature difference is caused. According to the temperature difference, inside the thermoelectric conversion layer, a difference of carrier density occurs in the direction of the temperature difference, and hence electric power is generated.

For example, by providing a heat source on the first substrate 12 side and causing a temperature difference between the high thermal conduction portion 12b of the first substrate 12 and the high thermal conduction portion 20b of the second substrate 20, inside the thermoelectric conversion layer 16, a difference of carrier density occurs in the direction of the temperature difference, and hence electric power is generated. Furthermore, by connecting wiring to the first electrode 26 and the second electrode 28, the electric power (electric energy) generated by the heating is taken out.

In the thermoelectric conversion element 10 of the present invention, the thermoelectric conversion layer 16 is basically formed of carbon nanotubes. The thermoelectric conversion layer 16 of the thermoelectric conversion element 10 of the present invention contains a surfactant in addition to CNT. In the following description, the carbon nanotube is referred to as CNT as well.

Furthermore, in the thermoelectric conversion layer 16, a mass ratio obtained by dividing the mass of CNT by the mass of the surfactant has a distribution. In the following description, the mass ratio obtained by dividing the mass of CNT by the mass of the surfactant is referred to as a mass ratio of "CNT/surfactant" as well.

Figure 2A:
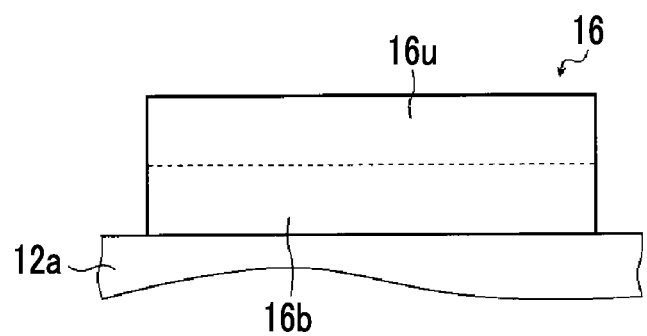
FIGS. 2A to 2D are schematic views for illustrating an example of the thermoelectric conversion element of the present invention.

Specifically, as schematically shown in FIG. 2A, provided that a region occupying 50% of the film thickness of the first substrate 12 side in the thickness direction of the thermoelectric conversion layer 16 is a lower layer portion 16b and a region other than the aforementioned region is a upper layer portion 16u, the mass ratio of "CNT/surfactant" is higher in the upper layer portion 16u than in the lower layer portion 16b. That is, the mass ratio of "CNT/surfactant" in the upper layer portion 16u is higher than the mass ratio of "CNT/surfactant" in the lower layer portion 16b. In the following description, the condition in which the mass ratio of "CNT/surfactant" is higher in the upper layer portion 16u than in the lower layer portion 16b is described as "upper layer portion 16u>lower layer portion 16b" as well.

Herein, the thickness direction of the thermoelectric conversion layer 16 is a direction orthogonal to the surface on which the thermoelectric conversion layer 16 is formed. In the example illustrated in the drawing, it is a direction orthogonal to the surface, on which the thermoelectric conversion layer 16 is formed, of the low thermal conduction portion 12a of the first substrate 12.

Figure 2B:
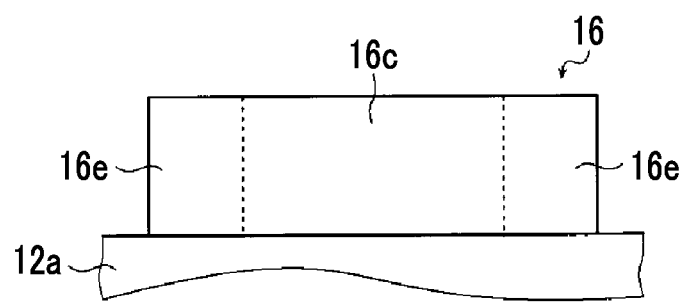

Alternatively, as schematically shown in FIG. 2B, provided that a region occupying 20% of the end portion side in the plane direction of the thermoelectric conversion layer 16 is an end region 16e and a region other than the aforementioned region is a central region 16c, the mass ratio of "CNT/surfactant" is higher in the end region 16e than in the central region 16c. That is, the mass ratio of "CNT/surfactant" in the end region 16e is higher than the mass ratio of "CNT/surfactant" in the central region 16c. In the following description, the condition in which the mass ratio of "CNT/surfactant" is higher in the end region 16e than in the central region 16c is described as "end region 16e>central region 16c" as well.

As described above, the plane direction is the substrate plane direction. The substrate plane direction is a direction of the surface on which the thermoelectric conversion layer 16 is formed. In the example illustrated in the drawing, it is a plane direction of the surface, on which the thermoelectric conversion layer 16 is formed, of the low thermal conduction portion 12a of the first substrate 12.

Figure 2C:
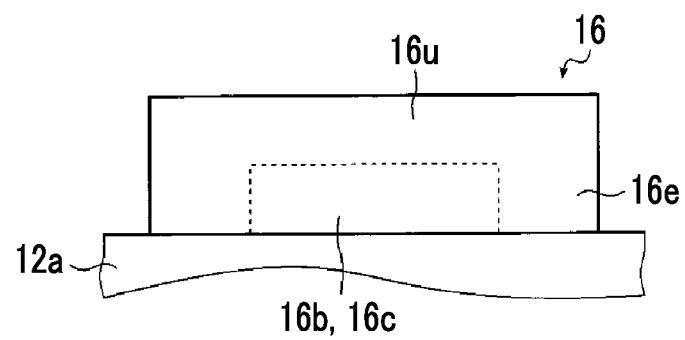

Alternatively, as schematically shown in FIG. 2C, in all of the upper layer portion 16u, the lower layer portion 16b, the end region 16e, and the central region 16c of the thermoelectric conversion layer 16, the mass ratio of "CNT/surfactant" satisfies both the "upper layer portion 16u>lower layer portion 16b" and the "end region 16e>central region 16c".

By adopting the aforementioned constitutions, the present invention accomplished both the excellent thermoelectric conversion performance and the excellent adhesiveness between the thermoelectric conversion layer 16 and the first substrate 12.

As described above, the general thermoelectric conversion element described in WO2012/121133A has a constitution in which the thermoelectric conversion layer is formed on the electrodes that are formed on the substrates and is interposed between the electrodes.

In contrast, in the in plane-type thermoelectric conversion element described in JP3981738B, the thermoelectric conversion layer is directly formed on the surface of the substrate such as a plastic film. Furthermore, the thermoelectric conversion layer of the in plane-type thermoelectric conversion element can be thinned, and therefore, a thermoelectric conversion element (thermoelectric conversion module) having excellent flexibility is obtained.

For the thermoelectric conversion element such as the in plane-type thermoelectric conversion element in which the thermoelectric conversion layer is directly formed on the substrate surface, in addition to the excellent thermoelectric conversion performance, excellent adhesiveness between the substrate and the thermoelectric conversion layer is required. Particularly, in order to obtain a thermoelectric conversion element (thermoelectric conversion module) having excellent flexibility, it is important for the substrate and the thermoelectric conversion layer to have excellent adhesiveness such that they are not peeled off from each other even if the thermoelectric conversion element is repeatedly bent or stretched.

In the thermoelectric conversion element of the present invention in which CNT demonstrating excellent thermoelectric conversion performance is used as a thermoelectric conversion material, by making the mass ratio of "CNT/surfactant" satisfy "upper layer portion 16$u$>lower layer portion 16$b$" and/or "end region 16$e$>central region 16$c$", both the high adhesiveness between the thermoelectric conversion layer 16 and the first substrate 12 and the excellent thermoelectric conversion performance are accomplished.

As described above, the thermoelectric conversion layer 16 is basically formed of CNT. Herein, the use of CNT alone is not enough to obtain sufficient adhesiveness between the thermoelectric conversion layer 16 and the first substrate 12 in some cases.

In contrast, if the thermoelectric conversion layer 16 contains a surfactant, due to a non-covalently bonding interaction between a polar group contained in the surfactant and a polar group contained in the first substrate 12, the formation of a covalent bond, or the like, the adhesiveness between the thermoelectric conversion layer 16 and the first substrate 12 can be improved.

However, in many cases, a surfactant is an insulator. Accordingly, if the thermoelectric conversion layer 16 contains the surfactant, a value of resistance of the thermoelectric conversion layer increases, and hence the thermoelectric conversion performance of the thermoelectric conversion layer 16 deteriorates.

In the thermoelectric conversion element 10 of the present invention, the mass ratio of "CNT/surfactant" in the thermoelectric conversion layer 16 satisfies "upper layer portion 16$u$>lower layer portion 16$b$" and/or "end region 16$e$>central region 16$c$".

Therefore, as shown in FIGS. 2A to 2C, a region with high surfactant concentration is provided in a portion where the first substrate 12, that is, the low thermal conduction portion 12$a$ comes into contact with the thermoelectric conversion layer 16. By the region with high surfactant concentration, high adhesiveness between the first substrate 12 and the thermoelectric conversion layer 16 can be secured. Furthermore, as shown in FIGS. 2A to 2C, the thermoelectric conversion layer 16 also has a region with low surfactant concentration in the upper layer portion 16$u$ or the end region 16$e$. Consequently, by the upper layer portion 16$u$ or the end region 16$e$, it is possible to secure high conductivity and to obtain excellent thermoelectric conversion performance.

In addition, in the present invention, the thermoelectric conversion layer 16 can be formed using a surfactant-added coating composition. Accordingly, the thermoelectric conversion layer 16 can be formed using a coating composition in which CNT is excellently dispersed. As a result, the thermoelectric conversion layer 16 containing a large amount of long and undefective CNT can be formed, and this also makes it possible to obtain excellent thermoelectric conversion performance.

Furthermore, by making the mass ratio of "CNT/surfactant" satisfy "end region 16$e$>central region 16$c$", it is possible to reduce the interfacial resistance between the electrode and the thermoelectric conversion layer 16 while securing the adhesiveness between the thermoelectric conversion layer 16 and the first substrate 12, and this also makes it possible to obtain excellent thermoelectric conversion performance.

Consequently, according to the present invention, it is possible to accomplish both the high adhesiveness between the thermoelectric conversion layer 16 and the first substrate 12 and the excellent thermoelectric conversion performance, and to obtain a thermoelectric conversion element (thermoelectric conversion module) excellent in mechanical strength, flexibility, and thermoelectric conversion performance.

In the thermoelectric conversion element 10 of the present invention, regarding the mass ratio of "CNT/surfactant" in the thermoelectric conversion layer 16, a value (hereinafter, described as "upper layer portion 16$u$/lower layer portion 16$b$" as well) obtained by dividing the mass ratio of "CNT/surfactant" in the upper layer portion 16$u$ by the mass ratio of "CNT/surfactant" in the lower layer portion 16$b$ is preferably greater than 1.0.

It is preferable that the mass ratio of "CNT/surfactant" expressed as "upper layer portion 16$u$/lower layer portion 16$b$" is greater than 1.0, because then both the high adhesiveness between the thermoelectric conversion layer 16 and the first substrate 12 and the excellent thermoelectric conversion performance can be more suitably accomplished.

Furthermore, regarding the mass ratio of "CNT/surfactant" in the thermoelectric conversion layer 16, a value obtained by dividing the mass ratio of "CNT/surfactant" in the end region 16$e$ by the mass ratio of "CNT/surfactant" in the central region 16$c$ is preferably greater than 1.0. In the following description, the value obtained by dividing the mass ratio of "CNT/surfactant" in the end region 16$e$ by the mass ratio of "CNT/surfactant" in the central region 16$c$ is referred to as "end region 16$e$/central region 16$c$" as well.

It is preferable that the mass ratio of "CNT/surfactant" expressed as "end region 16$e$/central region 16$c$" is greater than 1.0, because then both the high adhesiveness between the thermoelectric conversion layer 16 and the first substrate 12 and the excellent thermoelectric conversion performance can be more suitably accomplished.

The mass ratio of "CNT/surfactant" in the thermoelectric conversion layer 16 may be measured using, for example, glow discharge optical emission spectroscopy (GD-OES), time-of-flight secondary ion mass spectrometry (TOF-SIMS), thermogravimetry/differential thermal analysis (TG-DTA), infrared microspectrometry, and the like.

The glow discharge optical emission spectroscopy (GD-OES) is a method of analyzing the elemental distribution in a depth direction of a film by sputtering a sample film formed on a substrate and analyzing the emission of sputtered atoms. By GD-OES, the mass ratio of "CNT/surfactant" in the depth direction can be analyzed.

The time-of-flight secondary ion mass spectrometry (TOF-SIMS) is a method of analyzing secondary ions, which are sputtered out by the irradiation of the surface of a sample on a substrate with primary ions, by using a time-of-flight mass spectrometer and analyzing the surface structure of the sample from the obtained spectrum. By TOF-SIMS, the mass ratio of "CNT/surfactant" in the depth direction can be analyzed.

The thermogravimetry-differential thermal analysis (TG-DTA) is a method of measuring the mass change or thermal change of a sample while varying the temperature of the sample according to a certain program. At a temperature of equal to or lower than 500° C., CNT is hardly decomposed while the surfactant is decomposed. Accordingly, the weight loss at a temperature of equal to or lower than 500° C. corresponds to the amount of the residual surfactant. For example, by analyzing each of samples in the central and end portions of the thermoelectric conversion layer through TG-DTA, the mass ratio of "CNT/surfactant" in the central and end portions can be calculated from the difference in the degree of weight loss between the samples.

As described above, in the thermoelectric conversion element 10 of the present invention, the thermoelectric conversion layer 16 contains CNT and a surfactant.

CNT is categorized into single-layer CNT composed of one sheet of carbon film (graphene sheet) wound in the form of a cylinder, double-layer CNT composed of two graphene sheets wound in the form of concentric circles, and multi-layer CNT composed of a plurality of graphene sheets wound in the form of concentric circles. In the present invention, each of the single-layer CNT, the double-layer CNT, and the multilayer CNT may be used singly, or two or more kinds thereof may be used in combination. Particularly, the single-layer CNT and the double-layer CNT excellent in conductivity and semiconductor characteristics are preferably used, and the single-layer CNT is more preferably used.

The single-layer CNT may be semiconductive or metallic. Furthermore, semiconductive CNT and metallic CNT may be used in combination. In a case where both the semiconductive CNT and the metallic CNT are used, a content ratio between the CNTs in the composition can be appropriately adjusted according to the use of the composition. In addition, CNT may contain a metal, and CNT containing molecules of fullerene and the like may be used.

The average length of CNT used in the present invention is not particularly limited and can be appropriately selected according to the use of the composition. Specifically, from the viewpoint of ease of manufacturing, film formability, conductivity, and the like, the average length of CNT is preferably 0.01 to 2,000 μm, more preferably 0.1 to 1,000 μm, and particularly preferably 1 to 1,000 μm, though the average length also depends on an inter-electrode distance.

The diameter of CNT used in the present invention is not particularly limited. However, from the viewpoint of durability, film formability, conductivity, semiconductor characteristics, and the like, it is preferably 0.4 to 100 nm, more preferably equal to or less than 50 nm, and particularly preferably equal to or less than 15 nm.

Particularly, in a case where the single-layer CNT is used, the diameter thereof is preferably 0.5 to 2.2 nm, more preferably 1.0 to 2.2 nm, and particularly preferably 1.5 to 2.0 nm.

The thermoelectric conversion layer 16 contains defective CNT in some cases. Because the defectiveness of CNT deteriorates the conductivity of the thermoelectric conversion layer 16, it is preferable that the amount of the defective CNT is small.

The thermoelectric conversion layer 16 is formed using a CNT dispersion liquid obtained by dispersing (dissolving) CNT and a surfactant in water. Accordingly, it is preferable that the CNT dispersion liquid for forming the thermoelectric conversion layer 16 contains a small amount of defective CNT.

The amount of defectiveness of CNT in the CNT dispersion liquid can be estimated by a G/D ratio between a G band and a D band in a Raman spectrum. If the G/D ratio is high, the composition can be assumed to be a CNT material with a small amount of defectiveness. In the present invention, the G/D ratio of the composition is preferably equal to or greater than 10 and more preferably equal to or greater than 30.

In the thermoelectric conversion layer 16, modified or processed CNT can also be used. Examples of the modification or processing method include a method of incorporating a ferrocene derivative or nitrogen-substituted fullerene (azafullerene) into CNT, a method of doping CNT with an alkali metal (potassium or the like) or a metallic element (indium or the like) by an ion doping method, a method of heating CNT in a vacuum, and the like.

In addition to the single-layer CNT or the multilayer CNT, the thermoelectric conversion layer 16 may contain nanocarbons such as carbon nanohorns, carbon nanocoils, carbon nanobeads, graphite, graphene, amorphous carbon, and the like.

In the present invention in which CNT is used in the thermoelectric conversion layer 16, the thermoelectric conversion layer 16 may contain a dopant.

As the dopant, various known dopants can be used. Specific examples thereof preferably include an alkali metal, a hydrazine derivative, metal hydride (sodium borohydride, tetrabutylammonium borohydride, lithium aluminum hydride, or the like), polyethylenimine, phosphine (triphenyl phosphine or the like), halogen (iodine, bromine, or the like), a Lewis acid ($PF_5$, $AsF_5$, or the like), protonic acid (hydrochloric acid, sulfuric acid, nitric acid, or the like), transition metal halide ($FeCl_3$, $SnCl_4$, or the like), an organic electron-accepting substance (a tetracyanoquinodimethane (TCNQ) derivative, a 2,3-dichloro-5,6-dicyano-p-benzoquinone (DDQ) derivative, or the like), and the like. One kind of these may be used singly, or two or more kinds thereof may be used in combination.

Among these, in view of the stability of the material, compatibility with CNT, and the like, polyethylenimine and an organic electron-accepting substance such as a TCNQ derivative or a DDQ derivative are preferable.

As described above, the thermoelectric conversion layer 16 contains a surfactant.

The surfactant is a compound having a portion (hydrophilic group), which has high affinity with water, and a portion (hydrophobic group), which has low affinity with water, in a molecule. In the present specification, the surfactant may be a low-molecular weight compound (compound having a molecular weight of equal to or less than 1,000) or a polymer compound having a predetermined repeating unit.

The type of the surfactant is not particularly limited, and known surfactants can be used as long as they have a function to disperse CNT. More specifically, as the surfactant, various surfactants can be used as long as they dissolve in water, a polar solvent, and a mixture of water and a polar solvent and exhibit adsorptivity with respect to CNT.

Examples of the surfactant include an ionic surfactant (an anionic surfactant, a cationic surfactant, or an amphoteric surfactant), a nonionic surfactant, and the like. Among these, an ionic surfactant is preferable, and an anionic surfactant is more preferable, because such a surfactant results in excellent thermoelectric conversion performance of the thermoelectric conversion layer 16 by excellently dispersing CNT and is easily washed off.

Examples of the anionic surfactant include fatty acid salts, abietates, hydroxyalkane sulfonates, alkane sulfonates, an aromatic sulfonic acid-based surfactant, dialkyl sulfosuccinates, linear alkylbenzene sulfonates, branched alkylbenzene sulfonates, alkyl naphthalene sulfonates, alkyl phenoxypolyoxyethylene propyl sulfonates, polyoxyethylene alkylsulfophenyl ether salts, N-methyl-N-oleyltaurine sodiums, N-alkylsulfosuccinic acid monoamide disodium salts, petroleum sulfonates, sulfated castor oil, sulfated beef tallow oil, sulfuric acid ester salts of fatty acid alkyl ester, alkyl sulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially saponified product of a styrene-maleic anhydride copolymer, a partially saponified product of an olefin-maleic anhydride copolymer, naphthalene sulfonate formalin condensates, aromatic sulfonates, aromatic substituted polyoxyethylene sulfonates, a monosoap-based anionic surfactant, an ether sulfate-based surfactant, a phosphate-based surfactant, a carboxylic acid-based surfactant, a fatty acid salt, and the like.

More specifically, examples of the anionic surfactant include octylbenzene sulfonate, nonylbenzene sulfonate, dodecylbenzene sulfonate, dodecyl diphenyl ether disulfonate, monoisopropyl naphthalene sulfonate, diisopropyl naphthalene sulfonate, triisopropyl naphthalene sulfonate, dibutyl naphthalene sulfonate, a naphthalene sulfonic acid formalin condensate salt, sodium cholate, potassium cholate, sodium deoxycholate, potassium deoxycholate, sodium glycocholate, potassium lithocholate, cetyl trimethyl ammonium bromide, and the like.

Herein, as the anionic surfactant, it is also possible to use an anionic group-containing polymer like a water-soluble polymer such as carboxymethyl cellulose and a salt thereof (a sodium salt, an ammonium salt, or the like), a polystyrene sulfonic acid ammonium salt, or a polystyrene sulfonic acid sodium salt.

Examples of the cationic surfactant include an alkylamine salt, a quaternary ammonium salt, and the like.

Examples of the amphoteric surfactant include an alkyl betaine-based surfactant and an amine oxide-based surfactant.

Examples of the nonionic surfactant include a sugar ester-based surfactant such as sorbitan fatty acid ester or polyoxyethylene sorbitan fatty acid ester, a fatty acid ester-based surfactant such as polyoxyethylene resin acid ester or diethyl polyoxyethylene fatty acid, fatty acid ester of polyhydric alcohol-type glycerol, fatty acid ester of pentaerythritol, fatty acid ester of sorbitol and sorbitan, fatty acid ester of sucrose, alkyl ether of polyhydric alcohol, fatty acid amide of alkanolamine, an ether-based surfactant such as polyoxyethylene alkyl ether, polyoxyethylene alkylphenyl ether, or polyoxyethylene-polypropylene glycol, and an aromatic nonionic surfactant such as polyoxyalkylene octylphenyl ether, polyoxyalkylene nonylphenyl ether, polyoxyalkyl dibutylphenyl ether, polyoxyalkyl styrylphenyl ether, polyoxyalkyl benzylphenyl ether, polyoxyalkyl bisphenyl ether, or polyoxyalkyl cumylphenyl ether.

As the nonionic surfactant, so-called water-soluble polymers can also be used. For example, sugar polymers such as polyvinyl alcohol, polyvinyl pyrrolidone, amylose, cycloamylose, and chitosan can also be used.

Specific examples of the usable surfactant are as below.

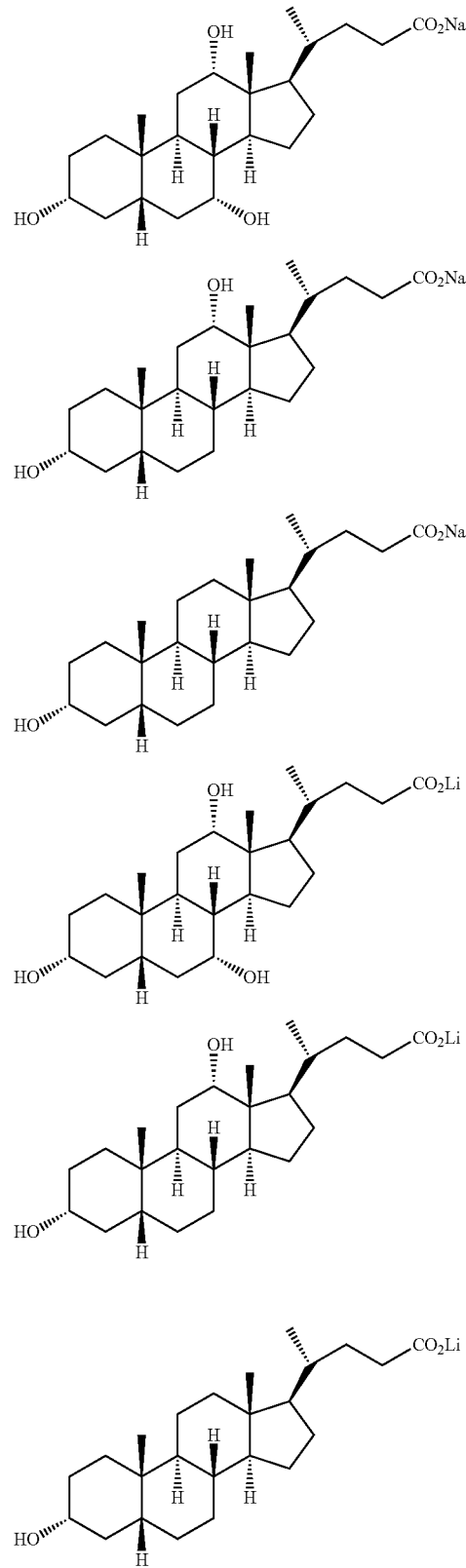

17
-continued
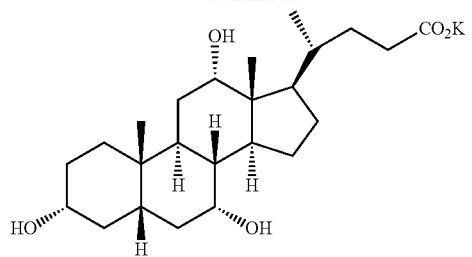
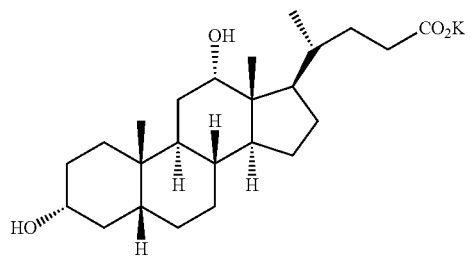
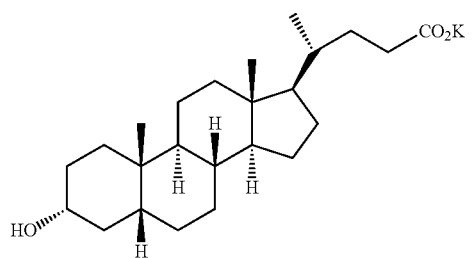
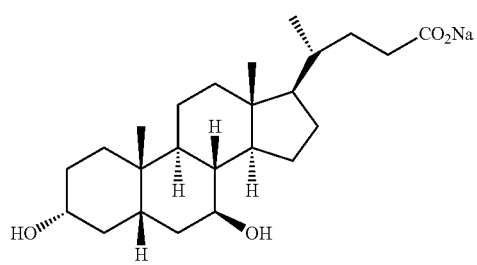
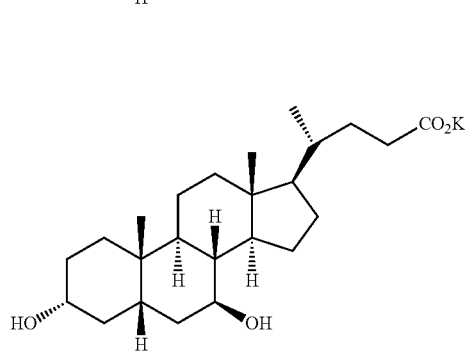
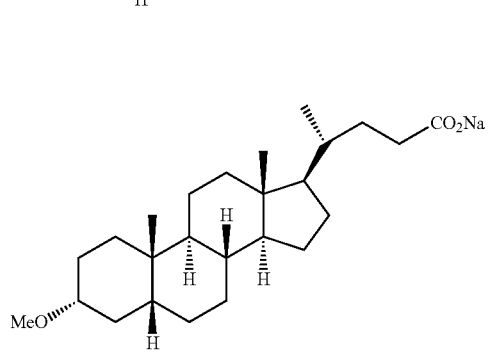
18
-continued
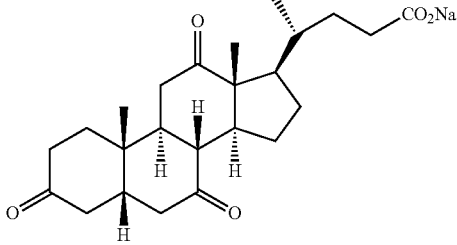
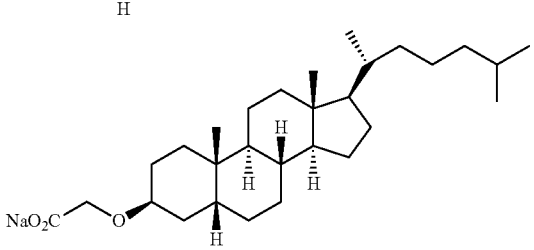
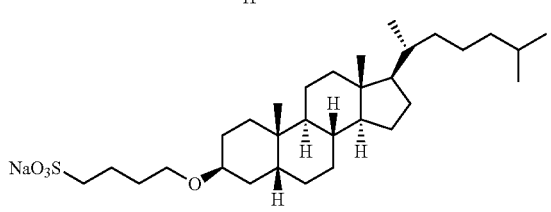
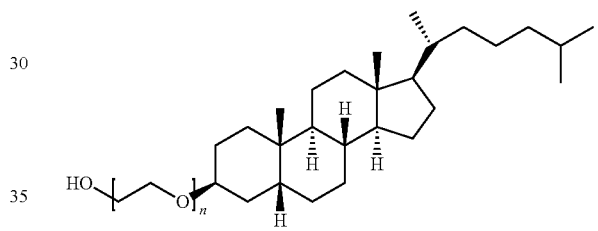
$C_{12}H_{25}$-C$_6H_4$-SO$_3$Na    $C_8H_{17}SO_3$Na
$C_{12}H_{25}(OCH_2CH_2)_nOH$    $C_{10}H_{21}SO_3$Na
$C_{14}H_{29}(OCH_2CH_2)_nOH$    $C_{12}H_{25}$-C$_6H_4$-SO$_3$K
$C_{12}H_{25}SO_3$Na    $C_{16}H_{33}(OCH_2CH_2)_nOH$
$C_{14}H_{29}SO_3$Na    $C_{16}H_{37}(OCH_2CH_2)_nOH$
$C_{12}H_{25}$-C$_6H_4$-SO$_3$Li    $C_{16}H_{33}SO_3$Na
$C_{18}H_{37}SO_3$Na    $C_{18}H_{37}SO_3$Na
$C_{12}H_{25}O$-C$_6H_4$-CO$_2$Na    $C_{18}H_{37}SO_3$K
$C_{16}H_{33}N^+Me_3Br^-$    $C_{18}H_{37}CO_2$Na    $PhCH_2N^+Me_3Br^-$

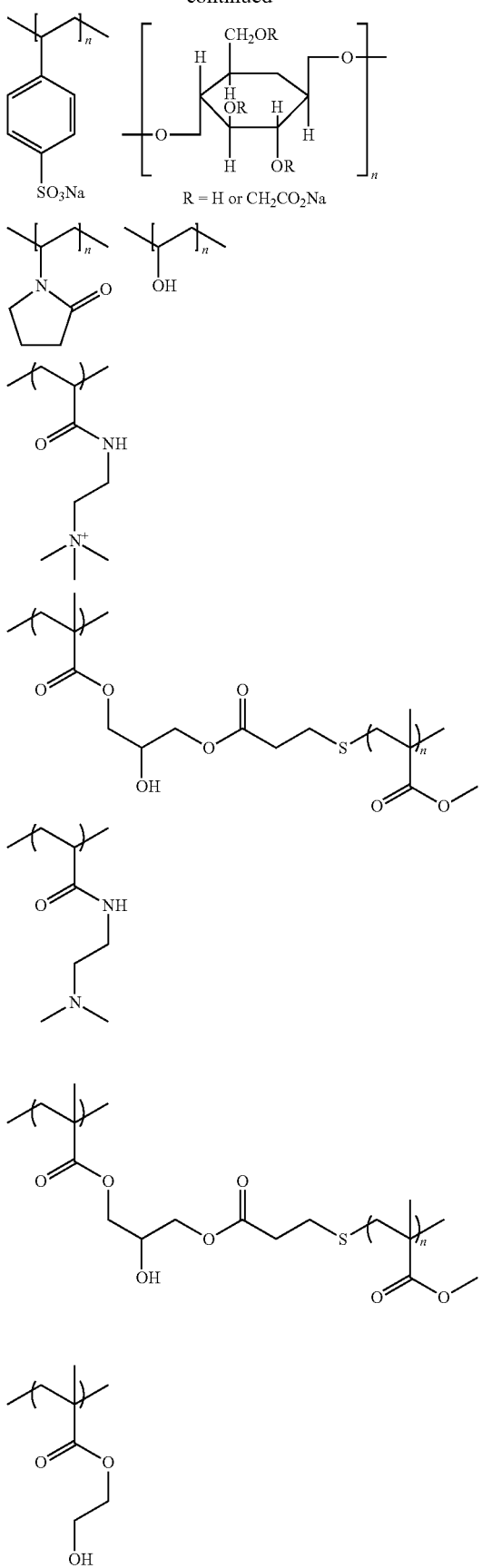
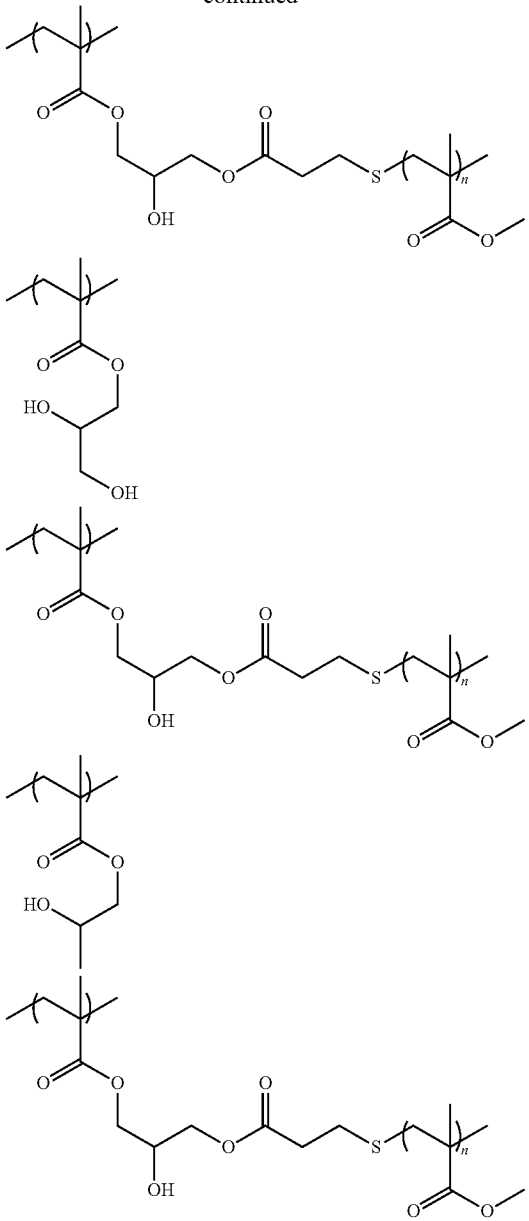

Among these surfactants, the ionic surfactant is preferable, and an anionic surfactant is more preferable. Particularly, cholate and deoxycholate are even more preferably used.

By using the ionic surfactant, particularly, cholate and deoxycholate as the surfactant, CNT can be excellently dispersed in the composition for forming the thermoelectric conversion layer 16. As a result, the thermoelectric conversion layer 16 containing a large amount of long and undefective CNT can be formed, and hence the thermoelectric conversion element 10 having excellent thermoelectric conversion performance can be obtained.

As described above, the thermoelectric conversion layer 16 is formed using the CNT dispersion liquid obtained by dispersing CNT and a surfactant in water. Herein, by using the ionic surfactant, particularly, cholate and deoxycholate as the surfactant, CNT can be better dispersed, and a dispersion liquid of long and undefective CNT can be obtained. Furthermore, because CNT can be dispersed at high concentration, the film thickness can be easily increased. Consequently, high thermoelectric conversion performance can be obtained. In addition, by using water as a dispersion solvent, shape stability of the CNT dispersion liquid when a dispersion liquid is applied on the first substrate 12, or the unwashed thermoelectric conversion layer can become excellent, and hence the thermoelectric conversion layer 16 having an intended shape can be stably formed. The above effects are more suitably obtained when the thermoelectric conversion layer 16 is formed by printing.

If necessary, the thermoelectric conversion layer 16 may contain a rheological modifier.

The amount of the rheological modifier in the thermoelectric conversion layer 16 is preferably 1% to 100% by mass and more preferably 1% to 75% by mass with respect to the carbon nanotubes.

The rheological modifier is a compound for modify rheology of the CNT dispersion liquid.

As the rheological modifier, known compounds can be used. However, the rheological modifier is preferably an electron-accepting compound capable of oxidizing carbon nanotubes.

Particularly, a rheological modifier having a redox potential of equal to or higher than −0.1 V with respect to a saturated calomel reference electrode is preferable. The upper limit of the redox potential is not limited, but is equal to or less than 1.5 V in many cases. The redox potential can be measured using a saturated calomel electrode as a reference electrode in cyclic voltammetry. The redox potential is measured at room temperature (25° C.) by using a dichloromethane solution or an acetonitrile solution containing a 0.1 M electrolyte (tetrabutylammonium hexafluorophosphate or tetrabutylammonium perchlorate) as an electrolytic solution at a sample concentration of 0.5 mM. Furthermore, the redox potential is measured under conditions of using a glassy carbon electrode as a working electrode and a platinum electrode as a counter electrode and setting a sweep rate to be 5 mV/sec.

As one of preferred embodiments of the rheological modifier, a compound represented by the following Formula (1) or a compound partially having a structure represented by the following Formula (1) is exemplified.

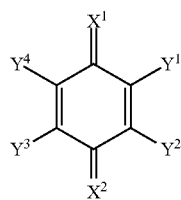

(1)

In Formula (1), each of $X^1$ and $X^2$ independently represents an oxygen atom, a sulfur atom, a group represented by *=C(CN)$_2$, a group represented by *=C(C(=O)R$^1$)$_2$, or a group represented by *=C(CO$_2$R$^1$)$_2$. Among these, in view of further improving the thermoelectric conversion characteristics of the thermoelectric conversion element, an oxygen atom and a group represented by *=C(CN)$_2$ are preferable.

$R^1$ represents a monovalent substituent. As the monovalent substituent, known groups (for example, an alkyl group, an aryl group, an alkoxy group, an aryloxy group, an acyloxy group, an acyl group, an alkoxycarbonyl group, an amino group, and a heterocyclic group) are used.

Each of $Y^1$ to $Y^4$ independently represents a cyano group, a fluorine atom, a chlorine atom, a hydrogen atom, an alkyl group, an alkoxy group, an alkylthio group, an aryl group, or a heteroaryl group. $Y^1$ and $Y^2$ or $Y^3$ and $Y^4$ may form a ring by being linked to each other. * represents a binding position.

As a preferred embodiment of the rheological modifier, an electron-accepting compound is exemplified, and examples thereof include a tetracyanoquinodimethane derivative such as tetracyanoquinodimethane, tetrafluoro-tetracyanoquinodimethane, or 2,5-difluoro-7,7,8,8-tetracyanoquinodimethane; a benzoquinone derivative such as tetrafluoro-1,4-benzoquinone, 2,3-dichloro-5,6-dicyano-p-benzoquinone, chloranil, or 2,6-dialkyl-1,4-benzoquinone; and the like.

In a case where the rheological modifier is the electron-accepting compound, the amount thereof added is preferably 5% to 100% by mass and more preferably 10% to 75% by mass with respect to the carbon nanotubes.

As another preferred embodiment of the rheological modifier, a compound having a hydrogen-bonding functional group is exemplified, and a polymer having a hydrogen-bonding functional group is preferable.

The hydrogen-bonding functional group should be a functional group forming a hydrogen bond, and examples thereof include a OH group, a NH$_2$ group, a NHR group (R represents aromatic or aliphatic hydrocarbon), a COOH group, a CONH$_2$ group, a NHOH group, a SO$_3$H group (sulfonic acid group), a —OP(=O)OH$_2$ group (phosphoric acid group), and a group having a —NHCO— bond, a —NH— bond, a —CONHCO— bond, a —NH—NH— bond, a —C(=O)— bond (carbonyl group), a —ROR— bond (ether group: each R independently represents divalent aromatic hydrocarbon or divalent aliphatic hydrocarbon; here, two Rs may be the same as or different from each other), or the like.

Examples of the polymer rheological modifier having a hydrogen-bonding functional group include carboxymethyl cellulose, carboxyethyl cellulose, methyl cellulose, ethyl cellulose, hydroxymethyl cellulose, hydroxyethyl cellulose, methyl hydroxypropyl cellulose, hydroxypropyl methylcellulose, crystalline cellulose, xanthan gum, guar gum, hydroxyethyl guar gum, carboxymethyl guar gum, tragacanth gum, locust bean gum, tamarind seed gum, psyllium seed gum, quince seeds, carrageenan, galactan, gum Arabic, pectin, pullulan, mannan, glucomannan, starch, curdlan, chondroitin sulfate, dermatan sulfate, glycogen, heparan sulfate, hyaluronic acid, keratin sulfate, chondroitin, mucoitin sulfate, dextran, keratosulfate, succinoglucan, charonin sulfate, alginic acid, propylene glycol alginate, macrogol, chitin, chitosan, carboxymethyl chitin, gelatin, agar, polyvinyl alcohol, polyvinyl pyrrolidone, a carboxyvinyl polymer, an alkyl-modified carboxyvinyl polymer, polyacrylic acid, an acrylic acid/alkyl methacrylate copolymer, polyethylene glycol, a (hydroxyethyl acrylate/sodium acryloyldimethyltaurate) copolymer, an (ammonium acryloyldimethyltaurate/vinyl pyrrolidone) copolymer, chemically modified starch, bentonite, and the like. Herein, a rheological modifier having an acidic group such as a carboxyl group may be partially or completely turned into a salt such as a sodium salt, a potassium salt, or an ammonium salt.

In a case where the rheological modifier is a polymer having the hydrogen-bonding functional group, the amount thereof added to the CNT dispersion liquid, which will be described later, is preferably 0.01% to 5% by mass and more preferably 0.01% to 3% by mass with respect to water.

In a case where the rheological modifier is a polymer, the weight-average molecular weight of the rheological modifier is preferably 5,000 to 5,000,000, more preferably 10,000 to 5,000,000, and particularly preferably 100,000 to 5,000,000. The weight-average molecular weight is measured by gel permeation chromatography (GPC).

For GPC, HLC-8220GPC (manufactured by Tosoh Corporation) is used. Furthermore, TSKgel G5000PW$_{XL}$, TSKgel G4000PW$_{XL}$, and TSKgel G2500PW$_{XL}$ (manufactured by Tosoh Corporation, 7.8 mmID×30 cm) are used as columns, and a 10 mM aqueous NaNO$_3$ solution is used as an eluant. In addition, GPC is performed using an RI detector under conditions of a sample concentration of 0.1% by mass, a flow rate of 1.0 ml/min (reference of 0.5 ml/min), a sample injection amount of 100 μl, and a measurement temperature of 40° C.

Moreover, a calibration curve is prepared from TSKstandard POLY(ETHYLENE OXIDE): "SE-150", "SE-30", "SE-8", "SE-5", "SE-2" (manufactured by Tosoh Corporation), polyethylene glycol having a molecular weight of 3,000, and hexaethylene glycol having a molecular weight of 282.

If necessary, the thermoelectric conversion layer 16 may be formed using a binder. As the binder, various known nonconductive resin materials (polymers) can be used.

In a case where the thermoelectric conversion layer 16 contains components in addition to CNT and a surfactant, the content of the components is preferably equal to or less than 50% by mass and more preferably equal to or less than 10% by mass.

In the thermoelectric conversion element 10 of the present invention, the thickness of the thermoelectric conversion layer 16, the size thereof in the plane direction, the length thereof in the inter-electrode direction, and the like should be appropriately set according to the material forming the thermoelectric conversion layer 16, the size of the thermoelectric conversion element 10, and the like.

According to the investigation conducted by the inventors of the present invention, the thickness of the thermoelectric conversion layer 16 is preferably equal to or greater than 1 μm and more preferably equal to or greater than 5 μm.

It is preferable that the thickness of the thermoelectric conversion layer 16 is equal to or greater than 1 μm, because then better thermoelectric conversion performance is obtained by reducing the value of resistance of the thermoelectric conversion layer 16, and the interfacial resistance between the thermoelectric conversion layer 16 (CNT) and the first and second electrodes 26, 28 can be reduced.

The size and shape of the thermoelectric conversion layer 16 in the plane direction are not particularly limited. However, from the viewpoint of improving output by increasing the number of thermoelectric conversion elements per unit area of the thermoelectric conversion module, it is preferable that the size of the thermoelectric conversion layer 16 in the plane direction is small. Specifically, one side of the thermoelectric conversion layer 16 in the plane direction is preferably 0.2 mm to 3,000 mm and more preferably 0.2 mm to 2,000 mm.

In the example illustrated in FIGS. 1A to 1C and FIGS. 2A to 2C, the thermoelectric conversion layer 16 has a rectangular shape. However, in the thermoelectric conversion element of the present invention, the thermoelectric conversion layer 16 can have various shapes.

Figure 2D:
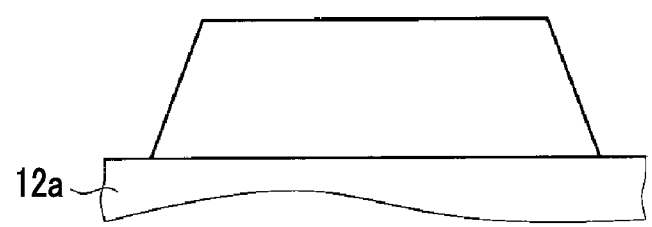

For example, as schematically shown in FIG. 2D, the thermoelectric conversion layer 16 may have the shape of a truncated square pyramid. Alternatively, it may have a cylindrical shape, a prism shape other than a quadrangular prism shape, a truncated cone shape, or a truncated pyramid shape or may have no definite shape.

On the surface of the first substrate 12, the first electrode 26 and the second electrode 28 are provided such that the thermoelectric conversion layer 16 is interposed between the electrodes in the plane direction.

In the thermoelectric conversion element 10 illustrated in the drawing, as shown in FIG. 1B and the like, the first electrode 26 and the second electrode 28 have such a shape that the electrodes rise from the first substrate 12 at the end of the thermoelectric conversion layer 16, passes through the lateral surface of the thermoelectric conversion layer 16, and reaches the vicinity of the end of the upper surface of the thermoelectric conversion layer 16.

In the thermoelectric conversion element of the present invention, the shape of the first electrode 26 and the second electrode 28 is not limited to the shape shown in FIG. 1B and the like. As long as the electrodes are connected to the thermoelectric conversion layer 16 with sufficient conductivity, they can have various shapes. For example, the thermoelectric conversion element may have a constitution in which the flat plate-like first electrode 26 and second electrode 28 are formed on the first substrate 12 before the thermoelectric conversion layer 16 is formed, and caused to come into contact with the thermoelectric conversion layer 16 such that the ends of the first electrode 26 and the second electrode 28 are covered with the thermoelectric conversion layer 16.

The first electrode 26 and the second electrode 28 can be formed of various materials as long as the materials have necessary conductivity.

Specifically, examples of the materials include a metal material such as copper, silver, gold, platinum, nickel, aluminum, constantan, chromium, indium, iron, or a copper alloy, a material such as indium tin oxide (ITO) or zinc oxide (ZnO) used as a transparent electrode in various devices, and the like. Among these, copper, gold, silver, platinum, nickel, a copper alloy, aluminum, constantan, and the like are preferable, and copper, gold, silver, platinum, and nickel are more preferable.

The thickness, size, shape, and the like of the first electrode 26 and the second electrode 28 should be appropriately set according to the thickness, size, and shape of the thermoelectric conversion layer 16, the size of the thermoelectric conversion element 10, and the like.

In a preferred embodiment of the thermoelectric conversion element 10 illustrated in the drawing, the pressure sensitive adhesive layer 18 covering the thermoelectric conversion layer 16, the first electrode 26, and the second electrode 28 is provided on the first substrate 12, and the second substrate 20 is stuck to the pressure sensitive adhesive layer 18.

As described above, in the thermoelectric conversion layer 16 of the thermoelectric conversion element 10 of the present invention, the mass ratio of "CNT/surfactant" has a distribution in which the mass ratio satisfies "upper layer portion 16$u$>lower layer portion 16$b$" and/or "end region 16$e$>central region 16$c$". Therefore, on the surface of the first substrate 12, the thermoelectric conversion layer 16 exhibiting sufficient adhesiveness can be formed.

However, because the upper portion of the thermoelectric conversion layer 16 is subjected to lamination after the thermoelectric conversion layer 16 is dried (cured), the adhesiveness of the upper portion is weaker than that of the first substrate 12. That is, the upper portion of the thermoelectric conversion layer 16 is a side separated from the second substrate 20.

Accordingly, by providing the pressure sensitive adhesive layer 18 and then providing the second substrate 20 thereon, the aforementioned in plane-type thermoelectric conversion element is constituted.

As the material forming the pressure sensitive adhesive layer 18, according to the materials forming the first substrate 12 (low thermal conduction portion 12a), the second substrate 20 (low thermal conduction portion 20a), the first electrode 26, and the second electrode 28, various materials that can be stuck to the aforementioned members can be used.

Specific examples thereof include an acryl resin, a urethane resin, a silicone resin, an epoxy resin, rubber, EVA, α-olefin polyvinyl alcohol, polyvinyl butyral, polyvinyl pyrrolidone, gelatin, starch, and the like. Furthermore, the pressure sensitive adhesive layer 18 may be formed using a commercially available double-sided tape or a commercially available pressure sensitive adhesive film.

The thickness of the pressure sensitive adhesive layer 18 should be appropriately set according to the material forming the pressure sensitive adhesive layer 18, the material forming the first substrate 12 and the second substrate 20, the size of the first substrate 12 and the second substrate 20, and the like such that sufficient adhesive force is obtained.

In at least one of the interface between the first substrate 12 and the pressure sensitive adhesive layer 18, the interface between the thermoelectric conversion layer 16 and the pressure sensitive adhesive layer 18, or the interface between the pressure sensitive adhesive layer 18 and the second substrate 20, in order to improve the adhesiveness, the surface of the substrate and/or the surface of the pressure sensitive adhesive layer may be subjected to a known surface treatment such as a plasma treatment, a UV ozone treatment, a corona discharge treatment, an electron beam irradiation treatment, or a sand blasting treatment such that the surface is modified or cleaned.

In the thermoelectric conversion element 10 illustrated in the drawing, the high thermal conduction portion 12b of the first substrate 12 and the high thermal conduction portion 20b of the second substrate 20 are in different positions in the plane direction in the inter-electrode direction so as to come into contact with each other in a state of facing each other in the inter-electrode direction.

For the thermoelectric conversion element of the present invention, various constitutions other than the above can be used.

For example, in the examples illustrated in FIGS. 1A to 1C, the high thermal conduction portion 12b of the first substrate 12 may be moved to the right side in the drawing, and the high thermal conduction portion 20b of the second substrate 20 may be moved to the left side in the drawing, such that the high thermal conduction portions are separated from each other in the inter-electrode direction along the plane direction. Specifically, in the plane direction, the high thermal conduction portion 12b of the first substrate 12 and the high thermal conduction portion 20b of the second substrate 20 are separated from each other preferably by 10% to 90% and more preferably by 10% to 50% along the inter-electrode direction, with respect to the size of the thermoelectric conversion layer 16 in the direction in which the first electrode 26 and the second electrode 28 are separated from each other.

Inversely, in the example illustrated in FIGS. 1A to 1C, the high thermal conduction portion 12b of the first substrate 12 may be moved to the left side in the drawing, and the high thermal conduction portion 20b of the second substrate 20 may be moved to the right side in the drawing, such that the high thermal conduction portions of the two substrates partially overlap each other in the plane direction.

Alternatively, a circular high thermal conduction portion may be formed on the first substrate, a square high thermal conduction portion having the same size as the circular high thermal conduction portion (the length of one side of the square is equal to the diameter of the circle) may be formed on the second substrate, and the two substrates are disposed such that the centers of the two high thermal conduction portions coincide with each other in the plane direction. In this constitution, although the distance between the two high thermal conduction portions is short, the end (peripheral) positions thereof are different in the plane direction. Therefore, in the thermoelectric conversion layer, a temperature difference is caused in the plane direction, and accordingly, electric power can be more efficiently generated compared to the thermoelectric conversion element in which a temperature difference is caused in the thickness direction.

Figure 3A:
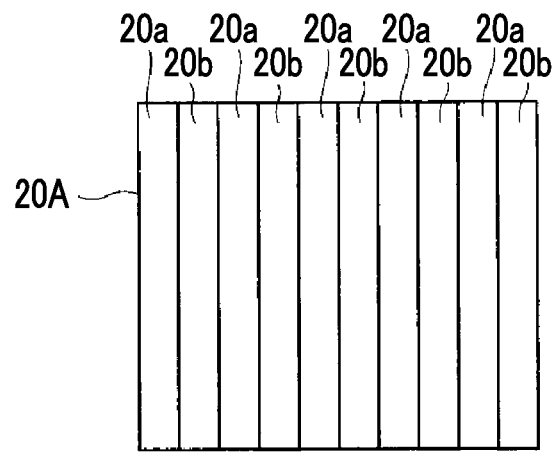
FIGS. 3A to 3D are schematic views for illustrating an example of a method for manufacturing a thermoelectric conversion module of the present invention.
Figure 3B:
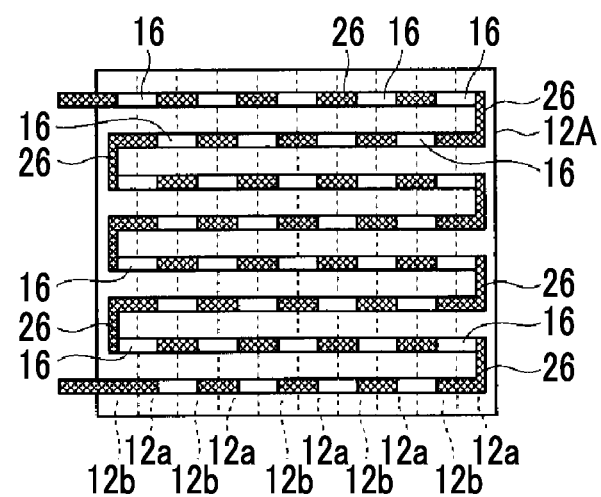
Figure 3C:
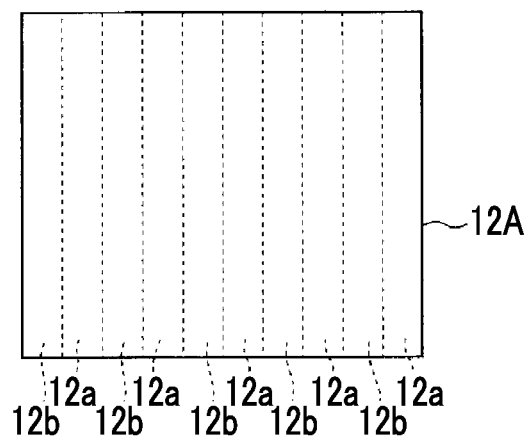
Figure 3D:
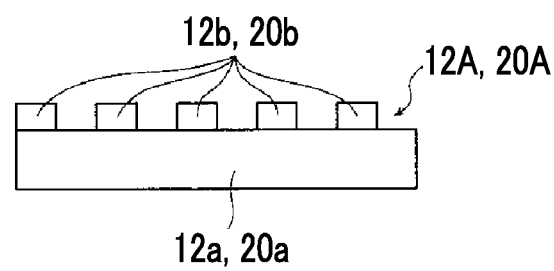

FIGS. 3A to 3D show an example of the thermoelectric conversion module of the present invention that is obtained by connecting a plurality of thermoelectric conversion elements 10 of the present invention in series. FIGS. 3A to 3C are top views, and FIG. 3D is a front view.

In the example, a first substrate 12A and a second substrate 20A have a constitution in which on the surface of a rectangular plate-like low thermal conduction material, quadrangular prism-like high thermal conduction portions extending in one direction are arranged at an equal interval, which equals to the length of one side of the quadrangular prism coming into contact with low thermal conduction portions, in a direction orthogonal to the extension direction of the quadrangular prisms.

That is, the first substrate 12A and the second substrate 20A have a constitution in which the entirety of one surface of the substrates is composed of a low thermal conduction portion, and the other surface of the substrate is composed of low thermal conduction portions and high thermal conduction portions which extend in one direction and are arranged at an equal interval in a direction orthogonal to the extension direction (see FIGS. 3A, 3C, and 3D).

Figure 4B:
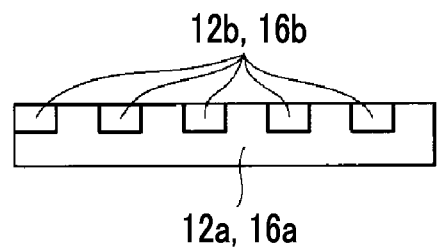
FIG. 4B is a schematic view showing another example of a substrate used in the thermoelectric conversion module of the present invention.

In the present example, the first substrate (second substrate) can also adopt various constitutions other than the constitution in which the high thermal conduction portions are disposed on the surface of the low thermal conduction portion. For example, as schematically shown in FIG. 4B, the first substrate may have a constitution in which in a rectangular plate-like low thermal conduction material, grooves extending in one direction (direction orthogonal to the paper surface of FIG. 4B) are formed in a direction orthogonal to the extension direction at an interval which equals to the width of the grooves, and a high thermal conduction material is incorporated into the grooves.

As schematically shown in FIGS. 3B and 3C, the thermoelectric conversion layer 16 has a rectangular plane shape and is formed on the surface, which is solely composed of the low thermal conduction portion 12a (state created when FIG. 3D is flipped upside down in a vertical direction), of the first substrate 12A, such that the center of the thermoelectric conversion layer 16 coincides with the boundary between the low thermal conduction portion 12a and the high thermal conduction portion 12b in the plane direction. The size of the thermoelectric conversion layer 16 in a horizontal direction of FIG. 3B is set such that it becomes 0.5 times but less than 2.0 times the width of the high thermal conduction portion 12b. That is, the horizontal direction of FIG. 3B is an arrangement direction along which the low thermal conduction portion 12a and the high thermal conduction portion 12b alternate with each other. In the following description, the horizontal direction of FIG. 3B is simply referred to as a horizontal direction as well.

The thermoelectric conversion layers 16 are formed in the horizontal direction at an equal interval on every other boundary between the low thermal conduction portion 12a and the high thermal conduction portion 12b. That is, the thermoelectric conversion layers 16 are formed such that the centers thereof in the horizontal direction are separated from each other at an equal interval that is 2 times the width of the high thermal conduction portion 12b.

Furthermore, the thermoelectric conversion layers 16 are two-dimensionally formed, such that lines of the thermoelectric conversion layers 16 arranged at an equal interval in the horizontal direction are arranged at an equal interval in a vertical direction of FIG. 3B. That is, the vertical direction of FIG. 3B is the extension direction of the low thermal conduction portion 12a and the high thermal conduction portion 12b. In the following description, the vertical direction of FIG. 3B is simply referred to as a vertical direction as well.

In addition, as shown in FIG. 3B, within the arrays of the thermoelectric conversion layers 16 in the horizontal direction, the lines adjacent to each other in the vertical direction are formed such that they deviate from each other in the horizontal direction by the width of the high thermal conduction portion 12b. That is, in the lines adjacent to each other in the vertical direction, the thermoelectric conversion layers 16 are formed such that the centers thereof in the horizontal direction alternate with each other by the width of the high thermal conduction portion 12b.

The thermoelectric conversion layers 16 are connected to each other in series through the first electrodes 26 (second electrodes 28). Specifically, as shown in FIG. 3B, in the arrays of the thermoelectric conversion layers 16 in the horizontal direction in the drawing, the first electrodes 26 are provided such that each of the thermoelectric conversion layers 16 is interposed therebetween in the horizontal direction. As a result, the thermoelectric conversion layers 16 arranged in the horizontal direction are connected to each other in series through the first electrodes 26. In FIG. 3B, the first electrodes 26 are shaded for clarifying the constitution.

Furthermore, at the end of the line of the thermoelectric conversion layers 16 in the horizontal direction, the thermoelectric conversion layers 16 in lines adjacent to each other in the vertical direction are connected to each other through the first electrode 26. When the thermoelectric conversion layers 16 are connected to each other in the vertical direction through the first electrode 26 at the end of the line in the horizontal direction, the thermoelectric conversion layer 16 at one end is connected to the thermoelectric conversion layer 16 at the end of an upper line that is on the same side as the one end, and the thermoelectric conversion layer 16 at the other end is connected to the thermoelectric conversion layer 16 at the end of a lower line that is on the same side as the other end.

As a result, all of the thermoelectric conversion layers 16 are connected to each other in series in the horizontal direction such that they look like a single line that is folded plural times.

As schematically shown in FIG. 3A, in a state where the surface, which is solely composed of the low thermal conduction portion 20a, of the second substrate 20A faces down, and the boundary between the low thermal conduction portion 20a and the high thermal conduction portion 20b coincides with the boundary between the high thermal conduction portion 12b and the low thermal conduction portion 12a of the first substrate 12A, the second substrate 20A is laminated on the thermoelectric conversion layers 16 and the first electrodes 26. The second substrate 20A is laminated such that the high thermal conduction portion 12b of the first substrate 12A and the high thermal conduction portion 20b of the second substrate 20A alternate with each other.

Herein, before the second substrate 20A is laminated, the pressure sensitive adhesive layer 18 is formed on the thermoelectric conversion layers 16 and the first electrodes 26 such that the first substrate 12A is totally covered with the pressure sensitive adhesive layer 18, though it is not illustrated in the drawing.

Accordingly, the low thermal conduction portions 12a of the first substrate 12A and regions, which are solely composed of the high thermal conduction portions 20b, of the second substrate 20A face each other in a state of coinciding with each other in the plane direction, and the high thermal conduction portions 12b of the first substrate 12A and regions, which are solely composed of the low thermal conduction portions 20a, of the second substrate 20A face each other in a state of coinciding with each other in the plane direction.

As a result, a thermoelectric conversion module in which a large number of thermoelectric conversion elements 10 of the present invention are connected in series is constituted.

As described above, the arrays of the thermoelectric conversion layers 16 in the horizontal direction are formed such that, in the lines adjacent to each other in the vertical direction, the center lines of the thermoelectric conversion layers 16 in the horizontal direction deviate from each other in the horizontal direction by the width of the high thermal conduction portion 12b (that is, the high thermal conduction portion 20b). That is, in the lines adjacent to each other in the vertical direction, the thermoelectric conversion layers 16 are formed such that the center lines of the thermoelectric conversion layers 16 in the horizontal direction alternate with each other by the width of the high thermal conduction portion 12b.

Therefore, as the thermoelectric conversion layers 16, which are connected to each other in series just like a single folded line, continue in one direction along the connection direction, half of the entirety of the thermoelectric conversion layers 16 face the high thermal conduction portions 12b of the first substrate 12A and the regions, which are solely composed of the low thermal conduction portions 20a, of the second substrate 20A, and the other half thereof face the regions, which are solely composed of the low thermal conduction portions 12a, of the first substrate 12A and the high thermal conduction portions 20b of the second substrate 20A.

For example, when the thermoelectric conversion module is seen in the series connection direction from the top to bottom of FIG. 3B, as shown in FIGS. 3A to 3C, half of the entirety of the thermoelectric conversion layers 16 on the upstream side face the high thermal conduction portions 12b of the first substrate 12A and the regions, which are solely composed of the low thermal conduction portions 20a, of the second substrate 20A, and the other half thereof on the downstream side face the regions, which are solely composed of the low thermal conduction portions 12a, of the first substrate 12A and the high thermal conduction portions 20b of the second substrate 20A.

Consequently, when a heat source is disposed on the first substrate 12A side or on the second substrate 20A side, in all of the thermoelectric conversion layers 16 connected to each other in series, a heat flow direction, that is, a direction in which the generated electricity flows coincides with the connection direction, and thus the thermoelectric conversion module can appropriately generate electric power.

Hereinafter, by explaining an example of a method for manufacturing the thermoelectric conversion module shown in FIGS. 3A to 3D, the method for manufacturing a thermoelectric conversion module of the present invention will be specifically described.

Herein, the thermoelectric conversion element of the present invention can be manufactured based on the method for manufacturing a thermoelectric conversion module.

First, the first substrate 12A (first substrate 12) having the low thermal conduction portions 12a and the high thermal conduction portions 12b and the second substrate 20A (second substrate 20) having the low thermal conduction portions 20a and the high thermal conduction portions 20b are prepared.

The first substrate 12A and the second substrate 20A should be prepared by known methods by using photolithography, etching, a film forming technique, and the like.

For example, the substrates can be prepared by etching the entirety of one surface of a copper polyimide film in which copper is laminated on both surfaces of polyimide and etching the other surface such that high thermal conduction portions are patterned. Furthermore, the first substrate 12A and the second substrate 20A may be prepared by preparing a sheet-like substance, which will become low thermal conduction portions, and sticking belt-like high thermal conduction portions to the sheet-like substance in a direction orthogonal to the extension direction of the belt at an interval that equals the width of the belt.

Herein, as the first substrate 12A and the second substrate 20A, commercially available products can also be used.

Meanwhile, the CNT dispersion liquid which is obtained by dispersing CNT and a surfactant in water and will become the thermoelectric conversion layers 16 (unwashed thermoelectric conversion layers) is prepared.

The CNT dispersion liquid should be prepared by known methods by using, for example, a homogenizer, a high-speed spin thin film disperser, an ultrasonic homogenizer, a beads mill, a ball mill, a roll mill, a jet mill, a super-high pressure processor, and the like. For example, the CNT dispersion liquid is prepared by a method in which a predetermined amount of CNT and surfactant are added to water and subjected to primary dispersion by using a homogenizer or the like, and the resulting dispersion liquid is subjected to secondary dispersion by using a high-speed spin thin film dispersing method.

In the present invention, the CNT dispersion liquid can be prepared using a surfactant. Accordingly, long and undefective CNT can be suitably dispersed in the CNT dispersion liquid.

In the CNT dispersion liquid, as a dispersion medium (solvent), in addition to water, various liquids can be used as long as they dissolve the surfactant and can disperse CNT (enable the surfactant to be adsorbed onto CNT).

Specifically, as the dispersion medium, it is possible to use water, methanol, ethanol, propanol, isopropanol, ethylene glycol, propylene glycol, acetone, 2-butanone, propylene glycol 1-monomethyl ether 2-acetate, 1-methoxy-2-propanol, dimethyl sulfoxide, butanol, sec-butanol, isobutyl alcohol, tert-butanol, glycerine, acetonitrile, N,N-dimethylformamide, N,N-dimethylacetamide, tetrahydrofuran, 1,4-dioxane, 1,3-dimethyl-2-imidazolidinone, N-methylpyrrolidone, N-ethylpyrrolidone, methyl carbitol, butyl carbitol, and the like.

Herein, the dispersion medium may be a mixture of two or more kinds of solvents.

In the CNT dispersion liquid, the concentration of CNT with respect to the solvent is preferably equal to or greater than 1% by mass and more preferably equal to or greater than 2% by mass.

It is preferable that the CNT concentration in the CNT dispersion liquid is equal to or greater than 1% by mass, because then thick thermoelectric conversion layers 16 having a thickness of equal to or greater than 1 µm can be easily obtained, and the thermoelectric conversion performance can be easily improved by reducing the resistance of the thermoelectric conversion element 10 (thermoelectric conversion module).

In the CNT dispersion liquid, the mass ratio of surfactant/CNT is preferably 0.5 to 20 and more preferably 1 to 10. That is, it is preferable that the mass ratio of surfactant/CNT in the CNT dispersion liquid (the composition containing CNT and a surfactant) and unwashed thermoelectric conversion layer is 1 to 10.

It is preferable that the mass ratio of surfactant/CNT in the CNT dispersion liquid is 0.5 to 20, because then both the dispersibility of CNT and the printing characteristics at the time of patterning the thermoelectric conversion layers 16 by printing can be accomplished.

In the CNT dispersion liquid, the content of carbon nanotubes with respect to water is preferably equal to or greater than 1% by mass, more preferably equal to or greater than 1.5% by mass, and particularly preferably equal to or greater than 2% by mass. If the content of carbon nanotubes is within the above range, viscosity of the composition is improved, and thus printing suitability is improved. Furthermore, a thick pattern having a film thickness of equal to or greater than 1 µm can be formed by printing, and the resistance can be reduced.

The CNT dispersion liquid may contain a rheological modifier, and the content of the rheological modifier in the CNT dispersion liquid is preferably 0.01% to 10% by mass with respect to water.

The content of the rheological modifier in the CNT dispersion liquid is preferably 1% to 100% by mass with respect to the carbon nanotubes.

The rheological modifier may be partially or completely removed through a step of removing the surfactant.

It is preferable to add an appropriate amount of rheological modifier to the CNT dispersion liquid, because then the printing suitability is improved due to the change in the viscoelastic properties of the CNT dispersion liquid, and yield of printing is improved. Furthermore, it is preferable to add an appropriate amount of rheological modifier to the CNT dispersion liquid, because then a doping effect is exerted on the carbon nanotubes depending on the rheological modifier, and the power generation capacity of the thermoelectric conversion module is improved.

Using the CNT dispersion liquid, on the surface, which is solely composed of the low thermal conduction portions 12a, of the first substrate 12A, the unwashed thermoelectric conversion layers, which will become the thermoelectric conversion layers 16 by being washed as will be described later, are formed by patterning as shown in FIG. 3B.

As the method for forming the unwashed thermoelectric conversion layers by patterning using the CNT dispersion liquid, various known methods can be used.

For example, the unwashed thermoelectric conversion layers are formed by a method in which the CNT dispersion liquid is patternwise printed on the first substrate 12A by a printing method, and then the CNT dispersion liquid is heated and dried.

As the printing method, it is possible to use various known printing methods such as screen printing, metal mask printing, gravure printing, flexographic printing, and offset printing. Among these, screen printing and metal mask printing are preferably used.

As described above, in the present invention, by using a surfactant and water or by using a surfactant, water, and a solvent mixture composed of the aforementioned solvents, the shape stability of the patternwise printed unwashed thermoelectric conversion layers can be improved, and the thermoelectric conversion layers 16 having an intended shape can be stably formed.

As another method, it is possible to use a method in which the entire surface of the first substrate 12A is coated with the CNT dispersion liquid; a layer containing CNT and a surfactant is formed on the surface of the first substrate 12A by drying the CNT dispersion liquid by heating; and then the unwashed thermoelectric conversion layers are formed by patterning by means of etching.

As the etching method, various known methods can be used. Examples thereof include laser engraving, a sand blasting method, an electron beam method, plasma etching, and the like. If necessary, the etching may be performed using a mask formed using photolithography, a metal mask, or the like.

After the unwashed thermoelectric conversion layers are formed by patterning as described above, the unwashed thermoelectric conversion layers are washed with a washing agent that does not dissolve CNT but dissolves the surfactant to partially remove the surfactant, thereby forming the thermoelectric conversion layers 16.

The surfactant is slowly removed by being washed from the surface of the unwashed thermoelectric conversion layers. By the washing, the mass ratio of "CNT/surfactant" in the thermoelectric conversion layers 16 can be made satisfy "upper layer portion 16u>lower layer portion 16b" and/or "end region 16e>central region 16c".

Furthermore, due to the removal of the surfactant from the unwashed thermoelectric conversion layers by means of washing, CNT is aggregated and forms network, and hence a conduction pass is formed. As a result, the conductivity of the thermoelectric conversion layers 16 can be improved, and the thermoelectric conversion layers 16 having high thermoelectric conversion performance can be formed.

As the washing agent, depending on the surfactant to be used, various liquids (solvents) that do not dissolve CNT but dissolve the surfactant can be used.

Examples thereof include water, methanol, ethanol, propanol, isopropanol, ethylene glycol, propylene glycol, acetone, 2-butanone, propylene glycol 1-monomethyl ether 2-acetate, 1-methoxy-2-propanol, dimethyl sulfoxide, butanol, sec-butanol, isobutyl alcohol, tert-butanol, glycerine, acetonitrile, N,N-dimethylformamide, N,N-dimethylacetamide, tetrahydrofuran, 1,4-dioxane, 1,3-dimethyl-2-imidazolidinone, N-methylpyrrolidone, N-ethylpyrrolidone, methyl carbitol, butyl carbitol, methyl acetate, ethyl acetate, cyclohexanone, and the like.

Herein, a C log P value of the washing agent is preferably −1.4 to 1 and more preferably −1.4 to 0.

It is preferable to use a washing agent having a C log P value of −1.4 to 1, because then the surfactant can be efficiently removed without causing swelling of the unwashed thermoelectric conversion layers and elution of CNT. Furthermore, in a case where water is used as the dispersion medium of the CNT dispersion liquid, because water can participate in azeotropy, residual moisture can be removed by being dried later.

The log P value means a common logarithm of a partition coefficient P, and is a value of physical properties that is obtained by quantitatively expressing the way a certain compound is partitioned in equilibrium in two-phase system consisting of oil (herein, n-octanol) and water by using a numerical value. The greater the log P value, the more the compound is hydrophobic, and the smaller the log P value, the more the compound is hydrophilic. Therefore, the log P value can be used as an indicator showing hydrophilicity and hydrophobicity of a compound.

$$\log P = \log(C\text{oil}/C\text{water})$$

Coil=molar concentration in oil phase

Cwater=molar concentration in water phase

Generally, the log P value can be experimentally determined using n-octanol and water. However, in the present invention, a partition coefficient (C log P value) (calculation value) determined using a log P value estimating program is used. Specifically, in the present specification, a Clog value determined using "ChemBioDraw ultra ver. 12" is used.

In order to wash the unwashed thermoelectric conversion layers with the aforementioned washing agent, various methods for exposing the unwashed thermoelectric conversion layers to the washing agent can be used.

For example, it is possible to use a method of dipping the first substrate 12A, on which the unwashed thermoelectric conversion layers are formed, into the washing agent. Furthermore, during the dipping, the washing agent may be stirred or circulated, ultrasonically vibrated, heated, or cooled.

The time of dipping into the washing agent should be appropriately set according to the type or amount of the surfactant in the unwashed thermoelectric conversion layers, the washing solvent (solubility of the surfactant), the washing conditions (temperature, stirring, and the like) described above, and the like. According to the investigation conducted by the inventors of the present invention, it is preferable that the dipping time is about 1 minute to 24 hours.

After the unwashed thermoelectric conversion layers are washed as described above, the washing agent is removed by heating and drying, thereby forming the thermoelectric conversion layers 16.

Thereafter, the first electrode 26 and the second electrode 28 are formed such that each of the thermoelectric conversion layers 16 is interposed therebetween in the plane direction.

The first electrode 26 and the second electrode 28 should be formed by known methods, such as vapor deposition, printing (for example, screen printing, metal mask printing, inkjet printing, or the like), and sticking to the substrate through a pressure-sensitive adhesive or an adhesive, according to the materials forming the first electrode 26 and the second electrode 28. The electrode pattern may be formed using a mask at the time of vapor deposition or printing. Alternatively, after being planarly formed, the electrodes may be patterned by a known method such as etching, sand blasting, laser engraving, or an electron beam method.

Then, on the entire surface of the first substrate 12A, the pressure sensitive adhesive layer 18 covering the thermoelectric conversion layers 16, the first electrodes 26, and the second electrodes 28 is formed.

The pressure sensitive adhesive layer 18 should be formed by a known method such as a coating method according to the material forming the pressure sensitive adhesive layer 18. As described above, the pressure sensitive adhesive layer 18 may be formed using a double-sided tape or a pressure sensitive adhesive film.

Furthermore, the surface, on which the high thermal conduction portions 20b are not formed, of the prepared second substrate 20A is caused to face the thermoelectric conversion layers 16, and in this state, the second substrate 20A is stuck to the thermoelectric conversion layers 16, thereby preparing the thermoelectric conversion element 10.

In the above example, the thermoelectric conversion layer 16 is formed on the surface of the first substrate 12A, and then the first electrode 26 and the second electrode 28 are formed. However, inversely, the first electrode 26 and the second electrode 28 may be formed on the surface of the first substrate 12A, and then the thermoelectric conversion layer may be formed.

In this case, the thermoelectric conversion layer 16 that covers the vicinity of the ends of the first electrode 26 and/or the second electrode 28 may be formed.

In the above example, the unwashed thermoelectric conversion layer is formed and then washed with a washing agent, thereby forming the thermoelectric conversion layer 16 in which the mass ratio of "CNT/surfactant" satisfies "upper layer portion 16u>lower layer portion 16b" and/or "end region 16e>central region 16c".

However, the thermoelectric conversion layer having the aforementioned distribution of the mass ratio of "CNT/surfactant" can be prepared by a method other than the above.

For example, it is possible to use a method for forming the thermoelectric conversion layer 16 by using two kinds of CNT dispersion liquids containing a different amount of surfactant.

That is, first, by using a CNT dispersion liquid containing a large amount of surfactant, the lower layer portion 16b of the thermoelectric conversion layer 16 is formed. Then, on the lower layer portion 16b, by using a CNT dispersion liquid containing a small amount of surfactant, the upper layer portion 16u of the thermoelectric conversion layer 16 is formed. In this way, the thermoelectric conversion layer 16 in which the mass ratio of "CNT/surfactant" satisfies "upper layer portion 16u>lower layer portion 16b" may be formed as shown in FIG. 2A.

Alternatively, first, by using a CNT dispersion liquid containing a large amount of surfactant, the central region 16c of the thermoelectric conversion layer 16 is formed. Then, by using a CNT dispersion liquid containing a small amount of surfactant, the end region 16e of the thermoelectric conversion layer 16 that surrounds the periphery of the central region 16c or interposes two opposite sides of the central region 16c therebetween is formed. In this way, the thermoelectric conversion layer 16 in which the mass ratio of "CNT/surfactant" satisfies "end region 16e>central region 16c" may be formed as shown in FIG. 2B.

In a case where two kinds of CNT dispersion liquids are used as described above, the CNT dispersion liquids may use different surfactants. For example, the CNT dispersion liquid which will become the lower layer portion 16b may use a surfactant that can bring about higher adhesiveness, and the CNT dispersion liquid which will become the upper layer portion 16u may use a surfactant that hinders conductivity to a small extent.

In the thermoelectric conversion element 10 illustrated in the drawing, as a preferred embodiment, the second substrate 20A is stuck to the pressure sensitive adhesive layer 18. However, in addition to this, the present invention can adopt various constitutions.

For example, after the thermoelectric conversion layers 16 are formed, the second substrate 20A may be laminated thereon without forming the pressure sensitive adhesive layer 18, and the first substrate 12A and the second substrate 20A may be fixed to each other by a known method of positioning and fixing two sheet-like substances such as a method of using a holding device like a clamp, thereby preparing the thermoelectric conversion module as shown in FIGS. 3A to 3D.

The thermoelectric conversion element and the thermoelectric conversion module of the present invention described above can be used for various purposes.

For example, they can be used for electric power generation in various ways, such as power generators including a hot spring heat power generator, a solar heat power generator, and a waste heat power generator or power sources of various devices including a power source for a wristwatch, a power source for driving a semiconductor, and a power source for a small sensor. Furthermore, the thermoelectric conversion element of the present invention can also be used not only for electric power generation but also for a sensor element such as a thermal sensor or a thermocouple.

Hitherto, the thermoelectric conversion element and the thermoelectric conversion module of the present invention as well as the manufacturing methods thereof have been specifically described, but the present invention is not limited to the examples described above. It goes without saying that the present invention may be improved or modified in various ways within a scope that does not depart from the gist of the present invention.

EXAMPLES

Hereinafter, the present invention will be more specifically described by illustrating specific examples of the present invention. However, the present invention is not limited to the following examples.

Example 1

<Preparation of CNT Dispersion Liquid A>

400 mg of CNT (manufactured by Meijo Nano Carbon) and 1,200 mg of sodium deoxycholate as a surfactant were added to 16 mL (milliliter) of water.

The solution was dispersed using a homogenizer with a blade for 2 minutes at 1,000 rpm and then for 5 minutes at 18,000 rpm. The obtained dispersion liquid was further dispersed using FILMIX (manufactured by PRIMIX Corporation) for 10 minutes at a circumferential speed of 30 m/sec by means of high-speed spin thin film dispersing method, thereby obtaining a CNT dispersion liquid A.

<Preparation of Thermoelectric Conversion Module>

A copper polyimide film, in which copper foil having a thickness of 70 μm was stuck to both surfaces of a polyimide film (surface energy: 27 mN/m) having a thickness of 25 μm, was prepared. The copper polyimide film was cut in sizes of 15 cm×12 cm and 12 cm×12 cm.

By etching the copper foil of the cut copper polyimide films, copper with a belt shape having a width of 2 cm was formed at an interval of 2 cm on one surface of the polyimide films, thereby preparing the first substrate 12A (15 cm×12 cm) and the second substrate 20A (12 cm×12 cm) with copper stripes having a width of 2 cm and an interval of 2 cm were prepared. That is, in the first substrate 12A and the second substrate 20A, the copper stripe is a high thermal conduction portion, and the portion in which the copper stripe is not formed and which is composed solely of the polyimide film is a low thermal conduction portion.

On the surface, which was solely composed of the low thermal conduction portion 12a, of the first substrate 12A, in a 10 cm×10 cm region, 8 patterns of the CNT dispersion liquid A were formed using a screen plate with openings having a size of 2 cm×2 cm by means of screen printing. The patterns of the CNT dispersion liquid A were formed such that the boundary between the high thermal conduction portion and the low thermal conduction portion coincided with the center of the 2 cm×2 cm pattern. That is, the boundary between the high thermal conduction portion and the low thermal conduction portion was a boundary between copper stripes.

The first substrate 12A on which the patterns of the CNT dispersion liquid A were formed was heated for 30 minutes at 50° C. on a hot plate and then further heated for 2.5 hours at 130° C. so as to dry the CNT dispersion liquid A, thereby forming unwashed thermoelectric conversion layers.

Thereafter, the first substrate 12A on which the unwashed thermoelectric conversion layers were formed was dipped into ethanol (C log P value: −0.235) for 5 minutes so as to wash the unwashed thermoelectric conversion layers, thereby removing sodium deoxycholate.

The first substrate 12A having undergone washing of the unwashed thermoelectric conversion layers was heated for 30 minutes at 50° C. on a hot plate and then further heated for 2.5 hours at 130° C., thereby preparing 8 thermoelectric conversion layers 16. The thickness of each of the thermoelectric conversion layers 16 was 5 μm.

Then, the 8 thermoelectric conversion layers 16 were connected to each other in series through the first electrodes 26 each of which was made of gold having a thickness of 200 nm. The first electrodes 26 were formed by vacuum vapor deposition using a mask.

Thereafter, as the pressure sensitive adhesive layer 18, a double-sided tape (adhesive transfer tape 8146-1, manufactured by 3M) having a thickness of 25 μm was stuck to the surface, which was solely composed of the low thermal conduction portion 20a, of the second substrate 20A. A protective sheet of the double-sided tape was peeled off, and the tape was stuck to the second substrate 20A such that the thermoelectric conversion layers 16 and the first electrodes 26 are covered, thereby preparing a thermoelectric conversion module shown in FIGS. 3A to 3D. The second substrate 20A was stuck to the pressure sensitive adhesive layer 18, such that the center of each of the thermoelectric conversion layers 16 coincided with the boundary between the copper stripes; the extension direction of the copper stripes coincided with that of the copper stripes of the first substrate 12A; and the copper stripes and those of the first substrate 12A did not overlap each other in the plane direction.

Example 2

A thermoelectric conversion module was prepared in the same manner as in Example 1, except that a CNT dispersion liquid prepared by adding sodium cholate instead of sodium deoxycholate was used.

Example 3

A thermoelectric conversion module was prepared in the same manner as in Example 1, except that a CNT dispersion liquid prepared by adding sodium dodecylbenzene sulfonate instead of sodium deoxycholate was used, and the time of dipping and washing of the unwashed thermoelectric conversion layers was changed to 15 minutes.

Example 4

A thermoelectric conversion module was prepared in the same manner as in Example 1, except that a CNT dispersion liquid prepared by adding EMULGEN 350 (manufactured by Kao Corporation) instead of sodium deoxycholate was used, and the time of dipping and washing of the unwashed thermoelectric conversion layers was changed to 1 hour.

Example 5

The same first substrate 12A and second substrate 20A as in Example 1 were prepared.

On the surface, which was solely composed of the low thermal conduction portion 12a, of the first substrate 12A, a 10 cm×10 cm region was coated with the same CNT dispersion liquid A as in Example 1 by blade coating. The first substrate 12A in which the 10 cm×10 cm region was coated with the CNT dispersion liquid A was heated for 30 minutes at 50° C. on a hot plate and then further heated for 2.5 hours at 130° C., thereby drying the CNT dispersion liquid A.

By patterning a thin film obtained by drying the CNT dispersion liquid A by means of laser engraving, 8 patterns having a size of 2 cm×2 cm were formed as unwashed thermoelectric conversion layers. Herein, the patterns were formed such that the boundary between copper stripes and the center of each of the 2 cm×2 cm patterns coincided with each other.

Subsequently, the first substrate 12A on which the unwashed thermoelectric conversion layers were formed was dipped into ethanol for 5 minutes so as to wash the unwashed thermoelectric conversion layers, thereby removing sodium deoxycholate.

The first substrate 12A having undergone washing of the unwashed thermoelectric conversion layers was heated for 30 minutes at 50° C. on a hot plate and then further heated for 2.5 hours at 130° C., thereby preparing 8 thermoelectric conversion layers 16. The thickness of each of the thermoelectric conversion layers 16 was 10 μm.

Then, a thermoelectric conversion module was prepared in the same manner as in Example 1.

Example 6

A thermoelectric conversion module was prepared in the same manner as in Example 5, except that 8 patterns having a size of 2 cm×2 cm were formed by a sand blasting method.

Example 7

<Preparation of CNT Dispersion Liquid B>

A CNT dispersion liquid B was prepared in the same manner as the CNT dispersion liquid A of Example 1, except that the amount of sodium deoxycholate added as a surfactant was changed to 800 mg from 1,200 mg.

<Preparation of Thermoelectric Conversion Module>

A copper polyimide film, in which copper foil having a thickness of 70 μm was stuck to both surfaces of a polyimide film (surface energy: 27 mN/m) having a thickness of 25 μm, was prepared. The copper polyimide film was cut in sizes of 14 cm×11 cm and 11 cm×11 cm.

By etching the copper foil of the cut copper polyimide films, copper with a belt shape having a width of 1 cm was formed at an interval of 1 cm on one surface of the polyimide films, thereby preparing the first substrate 12A (14 cm×11 cm) and the second substrate 20A (11 cm×11 cm) with copper stripes having a width of 1 cm and an interval of 1 cm. Also in the first substrate 12A and the second substrate 20A, the copper stripe is a high thermal conduction portion, and the portion which is solely composed of the polyimide film is a low thermal conduction portion.

On the surface, which was solely composed of the low thermal conduction portion 12a, of the first substrate 12A, in a 9 cm×9 cm region, 23 patterns of the same CNT dispersion liquid A as in Example 1 were formed by screen printing by using a screen plate with openings having a size of 1 cm×1 cm. The patterns of the CNT dispersion liquid A were also formed such that the boundary between the copper stripes and the center of each of the 1 cm×1 cm patterns coincided with each other.

The first substrate 12A on which the patterns of the CNT dispersion liquid A were formed was dried in the same manner as in Example 1. The film thickness of each of the patterns was 5 μm.

Then, on the dried 23 patterns, the CNT dispersion liquid B was screen-printed and then dried in the same manner as the CNT dispersion liquid A, thereby forming 23 thermoelectric conversion layers 16 consisting of lower layers formed of the CNT dispersion liquid A (amount of surfactant added: 1,200 mg) and upper layers formed of the CNT dispersion liquid B (amount of surfactant added: 800 mg). The film thickness of each of the thermoelectric conversion layers was 10 μm.

Thereafter, the 23 thermoelectric conversion layers 16 were connected to each other in series through the first electrodes 26 each of which was made of gold having a thickness of 200 nm. The first electrodes 26 were formed by vacuum vapor deposition using a mask.

Then, the pressure sensitive adhesive layer 18 was formed in the same manner as in Example 1.

The surface, which was solely composed of the low thermal conduction portion 20a, of the second substrate 20A prepared as above was caused to face the pressure sensitive adhesive layer 18, and in this state, the second substrate 20A was stuck to the pressure sensitive adhesive layer 18, thereby preparing a thermoelectric conversion module shown in FIGS. 3A to 3D. Herein, the second substrate 20A was stuck to the pressure sensitive adhesive layer 18, such that the center of each of the thermoelectric conversion layers 16 coincided with the boundary between the copper stripes; the extension direction of the copper stripes coincided with that of the copper stripes of the first substrate 12A; and the copper stripes and those of the first substrate 12A did not overlap with each other in the plane direction.

Example 8

The same first substrate 12A and second substrate 20A as in Example 1 were prepared.

On the first substrate 12A, within a 10 cm×10 cm region, 8 patterns of the same CNT dispersion liquid A as in Example 1 were formed using a screen plate with openings having a size of 1 cm×2 cm by means of screen printing. These patterns of CNT dispersion liquid A were also formed such that the boundary between copper stripes coincided with the center of each of the 1 cm×2 cm patterns.

The first substrate 12A on which the patterns of the CNT dispersion liquid A were formed was dried in the same manner as in Example 1. The film thickness of each of the patterns was 5 μm.

Then, the same CNT dispersion liquid B as in Example 7 was screen-printed using a screen plate with openings having a size of 0.5 cm×2 cm, such that each of the dried patterns was interposed between patterns of the CNT dispersion liquid B at short sides thereof. The CNT dispersion liquid B was then dried in the same manner as described above, thereby forming 8 thermoelectric conversion layers 16 having a size of 2 cm×2 cm.

Thereafter, a thermoelectric conversion module was prepared in the same manner as in Example 1.

Example 9

A thermoelectric conversion module was prepared in the same manner as in Example 1, except that methyl carbitol was used instead of water; a CNT dispersion liquid prepared by adding a polymer 1, which was synthesized from 2-hydroxyethyl methacrylate (HEMA, manufactured by Wako Pure Chemical Industries, Ltd.) and a macromonomer AA-6 (manufactured by TOAGOSEI CO., LTD., molecular weight: about 6,000) as below, instead of sodium deoxycholate was used; and the unwashed thermoelectric conversion layers were washed by being dipped for 6 hours into ethyl acetate (C log P value: 0.711) instead of ethanol.

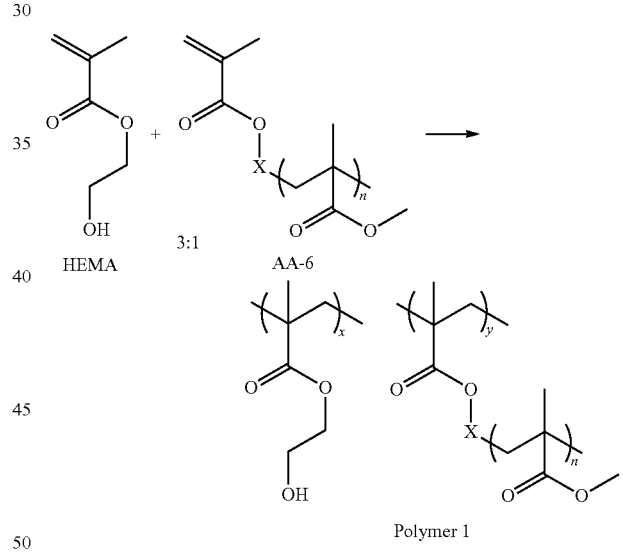

Example 10

A thermoelectric conversion module was prepared in the same manner as in Example 1, except that a CNT dispersion liquid prepared by adding potassium deoxycholate instead of sodium deoxycholate was used.

Example 11

A thermoelectric conversion module was prepared in the same manner as in Example 1, except that the amount of CNT added was changed to 120 mg from 400 mg, and a CNT dispersion liquid prepared by adding 360 mg of potassium octadecylsulfonate instead of 1,200 mg of sodium deoxycholate was used.

Example 12

A thermoelectric conversion module was prepared in the same manner as in Example 11, except that a CNT dispersion liquid prepared by adding hexadecyltrimethylammonium bromide instead of potassium octadecylsulfonate was used.

The thickness of each of the thermoelectric conversion layers 16 was 2 μm.

Example 13

A thermoelectric conversion module was prepared in the same manner as in Example 11, except that a CNT dispersion liquid prepared by adding n-octyl β-D-glucopyranoside instead of potassium octadecylsulfonate was used.

The thickness of each of the thermoelectric conversion layers 16 was 2 μm.

Example 14

A thermoelectric conversion module was prepared in the same manner as in Example 1, except that in preparing the CNT dispersion liquid A, the amount of CNT was changed to 200 mg from 400 mg, and the amount of sodium deoxycholate was changed to 600 mg from 1,200 mg.

The thickness of each of the thermoelectric conversion layers 16 was 2 μm.

Example 15

<Preparation of CNT Dispersion Liquid C>

40 mg of CNT (manufactured by Meijo Nano Carbon) and 400 mg of sodium deoxycholate as a surfactant were added to 16 mL of water.

The solution was dispersed using a homogenizer with a blade for 5 minutes at 1,000 rpm. The obtained dispersion liquid was further dispersed using FILMIX (manufactured by PRIMIX Corporation) for 10 minutes at a circumferential speed of 30 m/sec by means of high-speed spin thin film dispersing method, thereby preparing a CNT dispersion liquid C.

<Preparation of Thermoelectric Conversion Module>

A copper polyimide film, in which copper foil having a thickness of 70 μm was stuck to both surfaces of a polyimide film (surface energy: 27 mN/m) having a thickness of 25 μm, was prepared. The copper polyimide film was cut in sizes of 15 cm×12 cm and 12 cm×12 cm.

By etching the copper foil of the cut copper polyimide films, copper with a belt shape having a width of 2 cm was formed at an interval of 2 cm on one surface of the polyimide films, thereby preparing the first substrate 12A (15 cm×12 cm) and the second substrate 20A (12 cm×12 cm) with copper stripes having a width of 2 cm and an interval of 2 cm. That is, in the first substrate 12A and the second substrate 20A, the copper stripe is a high thermal conduction portion, and the portion in which the copper stripe is not formed and which is composed solely of the polyimide film is a low thermal conduction portion.

On the surface, which was solely composed of the low thermal conduction portion 12a, of the first substrate 12A, in a 10 cm×10 cm region, 8 patterns of the CNT dispersion liquid C were formed using a screen plate with openings having a size of 2 cm×2 cm by means of screen printing. The patterns of the CNT dispersion liquid C were formed such that the boundary between the high thermal conduction portion and the low thermal conduction portion (boundary between copper stripes) coincided with the center of each of the 2 cm×2 cm patterns.

The first substrate 12A on which the patterns of the CNT dispersion liquid C were formed was dried by being heated for 30 minutes at 50° C. on a hot plate and then further heated for 2.5 hours at 130° C.

On the patterns formed of the CNT dispersion liquid C, the same CNT dispersion liquid as in Example 3 was superimposed and printed by using a screen plate with openings having a size of 2 cm×2 cm by means of screen printing.

The first substrate 12A on which the patterns of the same CNT dispersion liquid as in Example 3 were formed was heated for 30 minutes at 50° C. on a hot plate and then further heated for 2.5 hours at 130° C., thereby forming the thermoelectric conversion layers 16. The film thickness of each of the thermoelectric conversion layers was 6 μm.

Then, the 8 thermoelectric conversion layers 16 were connected to each other in series through the first electrodes 26 each of which was made of silver having a thickness of 200 nm. The first electrodes 26 were formed by screen printing by using silver paste.

Thereafter, as the pressure sensitive adhesive layer 18, a double-sided tape (adhesive transfer tape 8146-1, manufactured by 3M) having a thickness of 25 μm was stuck to the surface, which was solely composed of the low thermal conduction portion 20a, of the second substrate 20A. A protective sheet of the double-sided tape was peeled off, and then the tape was stuck to the first substrate 12A such that the thermoelectric conversion layers 16 and the first electrode 26 were covered, thereby preparing the thermoelectric conversion module shown in FIGS. 3A to 3D. Herein, the second substrate 20A was stuck to the first substrate 12A, such that the center of each of the thermoelectric conversion layers 16 coincided with the boundary between the copper stripes; the extension direction of the copper stripes coincided with that of the copper stripes of the first substrate 12A; and the copper stripes and those of the first substrate 12A did not overlap with each other in the plane direction.

Comparative Example 1

A thermoelectric conversion module was prepared in the same manner as in Example 1, except that the unwashed thermoelectric conversion layers were directly used as thermoelectric conversion layers without being washed with ethanol.

The film thickness of each of the thermoelectric conversion layers was 10 μm.

Comparative Example 2

A thermoelectric conversion module was prepared in the same manner as in Example 7, except that patterns of lower layers were formed using the same CNT dispersion liquid B as in Example 7, and then patterns were formed thereon by using the same CNT dispersion liquid A as in Example 1.

Comparative Example 3

A thermoelectric conversion module was prepared in the same manner as in Example 8, except that patterns of central regions were formed using the same CNT dispersion liquid B as in Example 7, and patterns of end regions were formed using the same CNT dispersion liquid A as in Example 1.

[Evaluation]

The thermoelectric conversion modules of Examples 1 to 15 and Comparative examples 1 to 3 prepared as above were evaluated in terms of the mass ratio of "CNT/surfactant" in the upper layer portion 16u and the lower layer portion 16b, the mass ratio of "CNT/surfactant" in the central region 16c and the end region 16e, adhesiveness, resistance, and output.

<Mass Ratio of "CNT/Surfactant" in Upper Layer Portion 16u and Lower Layer Portion 16b>

For each of the prepared thermoelectric conversion modules, by glow discharge emission spectrometry, the mass ratio of "CNT/surfactant" in the upper layer portion 16u and the lower layer portion 16b was calculated from the emission intensity of each of carbon atoms and heteroatoms of the thermoelectric conversion layer 16 in the thickness direction.

Herein, the carbon atoms result from CNT and the surfactant while the heteroatoms solely result from the surfactant. In a case where the surfactant is sodium deoxycholate, the heteroatoms are sodium atoms and oxygen atoms.

The evaluation criteria are as below.

A: The mass ratio of "CNT/surfactant" expressed as "upper layer portion 16u/lower layer portion 16b" was greater than 1.

B: The mass ratio of "CNT/surfactant" expressed as "upper layer portion 16u/lower layer portion 16b" was equal to or less than 1.

<Mass Ratio of "CNT/Surfactant" in Central Region 16c and End Region 16e>

For each of the prepared thermoelectric conversion modules, the central region 16c and the end region 16e of the thermoelectric conversion layer 16 were scrapped off in an amount of about 2 mg, and a level of weight loss up to 500° C. was measured by TG-DAT, thereby calculating the mass ratio of "CNT/surfactant". The evaluation criteria are as below.

A: The mass ratio of "CNT/surfactant" expressed as "end region 16e/central region 16c" was greater than 1.

B: The mass ratio of "CNT/surfactant" expressed as "end region 16e/central region 16c" was equal to or less than 1.

<Adhesiveness>

Before the pressure sensitive adhesive layer 18 was formed, each of the thermoelectric conversion modules was fixed using a patch having a bending radius of 10 mm. The thermoelectric conversion module was bent 90° and then unbent and bent again 90° to the other side and then unbent. This operation was repeated three times.

Subsequently, the state of peeling of the interface between the thermoelectric conversion layer 16 and the first substrate 12A was visually checked. The evaluation criteria are as below.

A: Peeling and swelling of the thermoelectric conversion layer 16 were not observed.

B: Either peeling or swelling of the thermoelectric conversion layer 16 could be confirmed.

C: Detachment of the thermoelectric conversion layer 16 could be confirmed.

<Resistance>

The value of resistance of each of the thermoelectric conversion modules was measured using a tester. By dividing the value of resistance by the number of thermoelectric conversion elements, the value of resistance of a single element was calculated. The value of resistance of a single element of each of the thermoelectric conversion modules was standardized by regarding the value of resistance of a single element of the thermoelectric conversion module of Comparative example 1 as 1. In Example 7 and Comparative example 2, the value of resistance of a single element of the thermoelectric conversion module of Comparative example 2 was standardized as 1, and in Example 8 and Comparative example 3, the value of resistance of a single element of the thermoelectric conversion module of Comparative example 3 was standardized as 1. The evaluation criteria are as below.

A: The value of resistance was less than 0.2.

B: The value of resistance was less than 0.8 and equal to or greater than 0.2.

C: The value of resistance was equal to or greater than 0.8.

<Output>

Each of the thermoelectric conversion modules, the first substrate 12 side down, was placed on a hot plate, and a Pelitier element for temperature control was installed on the second substrate 20.

In a state where the temperature of the hot plate was kept at 100° C., the temperature of the Pelitier element was reduced, such that a temperature difference of 10° C. was caused between the first substrate 12 and the second substrate 20 of the thermoelectric conversion module.

In this state, current-voltage characteristics were measured using a SourceMeter (manufactured by Keithley Instruments Inc.), and a short circuit current and an open circuit voltage were measured. From the measurement results, output was calculated by "output=current×voltage/4". By dividing the calculated output by the number of thermoelectric conversion elements, the output of a single element was calculated. The output of a single element of each of the thermoelectric conversion modules was standardized by regarding the output of a single element of the thermoelectric conversion module of Comparative example 1 as 1. In Example 7 and Comparative example 2, the output of a single element of the thermoelectric conversion module of Comparative example 2 was standardized as 1, and in Example 8 and Comparative example 3, the output of a single element of the thermoelectric conversion module of Comparative example 3 was standardized as 1. The evaluation criteria are as below.

A: The output was greater than 100.

B: The output was greater than 10 and equal to or less than 100.

C: The output was greater than 1.5 and equal to or less than 10.

D: The output was equal to or less than 1.5.

The results are shown in the following table.

TABLE 1

| | | Thermoelectric conversion layer | | | Evaluation | | |
|---|---|---|---|---|---|---|---|
| | | | CNT/surfactant | | | | |
| | Surfactant | Film thickness [μm] | Upper layer/ lower layer | End portion/ Central portion | Adhe- siveness | Resis- tance | Out- put |
| Example 1 | Sodium deoxycholate | 5 | A | A | A | A | A |
| Example 2 | Sodium cholate | 5 | A | A | A | A | A |
| Example 3 | Sodium dodecyl- benzene sulfonate | 5 | A | A | A | A | A |
| Example 4 | EMULGEN 350 | 5 | A | A | B | A | B |
| Example 5 | Sodium deoxycholate | 10 | A | A | A | A | A |
| Example 6 | Sodium deoxycholate | 10 | A | A | A | A | A |
| Example 7 | Sodium deoxycholate | 10 | A | B | A | B | C |
| Example 8 | Sodium deoxycholate | 5 | B | A | A | B | C |
| Example 9 | Polymer 1 | 5 | A | A | A | B | B |
| Example 10 | Potassium deoxycholate | 5 | A | A | A | A | A |
| Example 11 | Potassium octadodecyl sulfonate | 2 | A | A | A | B | B |
| Example 12 | Hexadecyl trimethyl- ammonium bromide | 2 | A | A | A | B | B |
| Example 13 | n-octyl β-D- glucopyranoside | 2 | A | A | A | B | B |
| Example 14 | Sodium deoxycholate | 2 | A | A | A | B | A |
| Example 15 | Sodium deoxycholate + sodium dodecyl- benzene sulfonate | 6 | A | B | A | A | A |
| Comparative example 1 | Sodium deoxycholate | 15 | B | B | A | C | D |
| Comparative example 2 | Sodium deoxycholate | 10 | B | B | A | C | D |
| Comparative example 3 | Sodium deoxycholate | 5 | B | B | A | C | D |

The element size of the thermoelectric conversion layer is 1 cm × 1 cm in Example 7 and Comparative example 2 and 2 cm × 2 cm in other examples.

As shown in Table 1, in all of the thermoelectric conversion modules of the present invention in which the mass ratio of "CNT/surfactant" satisfies "upper layer portion 16u>lower layer portion 16b" and/or "end region 16e>central region 16c", all of the adhesiveness between the first substrate 12A and the thermoelectric conversion layers 16, an excellent value of resistance of the thermoelectric conversion layers 16, and excellent thermoelectric conversion performance are accomplished. Herein, as is evident from the comparison between Examples 1 to 4, the adhesiveness and output are better in Examples 1 to 3 using an ionic surfactant than in Example 4 using a nonionic surfactant. Furthermore, as is evident from the comparison between Examples 11 to 14, the use of deoxycholate as a surfactant makes it possible to obtain excellent output.

In contrast, in Comparative example 1 in which washing of the unwashed thermoelectric conversion layers is not performed, the mass ratio of "CNT/surfactant" is uniform in the entire thermoelectric conversion layers or has a distribution opposite to that of Examples. Therefore, although the adhesiveness between the first substrate 12A and the thermoelectric conversion layers 16 is excellent, the value of resistance is great, and the thermoelectric conversion performance is poor. In addition, Comparative example 2, in which the mass ratio of "CNT/surfactant" between the upper layer portion and the lower layer portion is the reverse of that of the present invention, has a higher value of resistance compared to Example 7, and accordingly, the output of Comparative example 2 is low. Furthermore, Comparative example 3, in which the mass ratio of "CNT/surfactant" between the end region and the central region is the reverse of that of the present invention, has higher resistance compared to Example 8, and accordingly, the output of Comparative example 3 is low.

Example 20

[Preparation of Printing Composition A]

400 mg of single-layer CNT (EC manufactured by Meijo Nano Carbon, average thickness of CNT: equal to or greater than 1 μm) was added to water in which 1,200 mg of sodium deoxycholate (manufactured by TOAGOSEI CO., LTD.) was dissolved. The obtained composition was mixed for 7 minutes by using a mechanical homogenizer (HIGH-FLEX HOMOGENIZER HF93 manufactured by SMT Corporation), thereby obtaining a premix. By using a thin film spin system high-speed mixer "FILMIX 40-40" (manufactured by PRIMIX Corporation), the obtained premix was dispersed in a thermostatic bath at 10° C. for 2 minutes at a circumferential speed of 10 m/sec and then for 5 minutes at a circumferential speed of 40 m/sec by a high-speed spin thin film dispersing method. To the obtained dispersion composition, 200 mg of tetrafluoro-tetracyanoquinodimethane was added, and the resultant was mixed for 2 minutes at 2,000 rpm by using a rotation/revolution mixer (AWATORI RENTARO manufactured by THINKY) and then defoamed for 2 minutes at 2,200 rpm, thereby preparing a printing composition.

The redox potential of the tetrafluoro-tetracyanoquinodimethane with respect to a saturated calomel reference electrode was 0.52 V.

Example 21

A printing composition was prepared in the same manner as in Example 20, except that the amount of tetrafluoro-tetracyanoquinodimethane used was changed to 140 mg from 200 mg.

Example 22

A printing composition was prepared in the same manner as in Example 20, except that tetrafluoro-tetracyanoquinodimethane (200 mg) was changed to 2,3,5,6-tetramethyl tetracyanoquinodimethane (400 mg).

The redox potential of the 2,3,5,6-tetramethyl tetracyanoquinodimethane with respect to a saturated calomel reference electrode was −0.10 V.

Example 23

A printing composition was prepared in the same manner as in Example 20, except that tetrafluoro-tetracyanoquinodimethane (200 mg) was changed to 2,5-difluoro-7,7,8,8-tetracyanoquinodimethane (240 mg).

The redox potential of the 2,5-difluoro-7,7,8,8-tetracyanoquinodimethane with respect to a saturated calomel reference electrode was 0.30 V.

Example 24

A printing composition was prepared in the same manner as in Example 20, except that tetrafluoro-tetracyanoquinodimethane (200 mg) was changed to 2,3-dichloro-5,6-dicyano-p-benzoquinone (100 mg).

The redox potential of the 2,3-dichloro-5,6-dicyano-p-benzoquinone with respect to a saturated calomel reference electrode was 0.50 V.

Example 25

A printing composition was prepared in the same manner as in Example 20, except that tetrafluoro-tetracyanoquinodimethane (200 mg) was changed to tetracyanoquinodimethane (200 mg).

The redox potential of the tetracyanoquinodimethane with respect to a saturated calomel reference electrode was 0.17 V.

Example 26

A printing composition was prepared in the same manner as in Example 20, except that the amount of carbon nanotubes used was changed to 480 mg from 400 mg; the amount of sodium deoxycholate used was changed to 2,400 mg from 1,200 mg; and tetrafluoro-tetracyanoquinodimethane (200 mg) was changed to tetracyanoquinodimethane (240 mg).

Example 27

A printing composition was prepared in the same manner as in Example 20, except that tetrafluoro-tetracyanoquinodimethane (200 mg) was changed to 2,5-dimethyl-7,7,8,8-tetracyanoquinodimethane (400 mg).

The redox potential of the 2,5-dimethyl-7,7,8,8-tetracyanoquinodimethane with respect to a saturated calomel reference electrode was 0.12 V.

Example 28

A printing composition was prepared in the same manner as in Example 20, except that tetrafluoro-tetracyanoquinodimethane (200 mg) was changed to tetrafluoro-1,4-benzoquinone (300 mg).

The redox potential of the tetrafluoro-1,4-benzoquinone with respect to a saturated calomel reference electrode was 0.070 V.

Example 29

1,200 mg of sodium deoxycholate (manufactured by Tokyo Chemical Industry Co., Ltd.) was dissolved in 16 mL of water, and 400 mg of single-layer CNT (EC manufactured by Meijo Nano Carbon, average length of CNT: equal to or greater than 1 μm) was added thereto. The obtained composition was mixed for 7 minutes by using a mechanical homogenizer (HIGH-FLEX HOMOGENIZER HF93 manufactured by SMT Corporation), thereby obtaining a premix. By using a thin film spin system high-speed mixer "FILMIX 40-40" (manufactured by PRIMIX Corporation), the obtained premix was dispersed in a thermostatic bath at 10° C. for 2 minutes at a circumferential speed of 10 m/sec and then for 5 minutes at a circumferential speed of 40 m/sec by a high-speed spin thin film dispersing method. To the obtained dispersion composition, 100 mg of a carboxymethyl cellulose sodium salt (manufactured by Sigma-Aldrich Co, LLC., high-viscosity product) was added, and the resultant was mixed for 2 minutes at 2,000 rpm by using a rotation/revolution mixer (AWATORI RENTARO manufactured by THINKY) and then defoamed for 2 minutes at 2,200 rpm, thereby preparing a printing composition.

Example 30

A printing composition was prepared in the same manner as in Example 29, except that the amount of carbon nanotubes used was changed to 200 mg from 400 mg; the amount of sodium deoxycholate used was changed to 400 mg from 1,200 mg; and the amount of carboxymethyl cellulose sodium salt used was changed to 150 mg from 100 mg.

Example 31

A printing composition was prepared in the same manner as in Example 29, except that the carboxymethyl cellulose sodium salt (100 mg) was changed to xanthan gum (50 mg).

Example 32

A printing composition was prepared in the same manner as in Example 29, except that sodium deoxycholate (1,200 mg) was changed to sodium cholate (1,200 mg).

Example 33

A printing composition was prepared in the same manner as in Example 29, except that the carboxymethyl cellulose sodium salt (100 mg) was changed to gelatin (100 mg).

Example 34

A printing composition was prepared in the same manner as in Example 29, except that the carboxymethyl cellulose sodium salt (100 mg) was changed to sodium polyacrylate (manufactured by Wako Pure Chemical Industries, Ltd.) (4 mg).

Example 35

100 mg of a carboxymethyl cellulose sodium salt (manufactured by Sigma-Aldrich Co, LLC., high-viscosity product) and 1,200 mg of sodium deoxycholate (manufactured by Tokyo Chemical Industry Co., Ltd.) were dissolved in 16 mL of water, and 400 mg of single-layer CNT (EC manufactured by Meijo Nano Carbon, average length of CNT: equal to or greater than 1 µm) was added thereto. The obtained composition was mixed for 7 minutes by using a mechanical homogenizer (HIGH-FLEX HOMOGENIZER HF93 manufactured by SMT Corporation), thereby obtaining a premix. By using a thin film spin system high-speed mixer "FILMIX 40-40" (manufactured by PRIMIX Corporation), the obtained premix was dispersed in a thermostatic bath at 10° C. for 2 minutes at a circumferential speed of 10 m/sec and then for 5 minutes at a circumferential speed of 40 m/sec by a high-speed spin thin film dispersing method. The obtained dispersion composition was mixed for 1 minute at 2,000 rpm by using a rotation/revolution mixer (AWATORI RENTARO manufactured by THINKY) and then defoamed for 1 minute at 2,200 rpm, thereby preparing a printing composition.

[Pattern Formation by Metal Mask Printing]

Each of the printing compositions of Examples 20 to 35 was printed on a polyimide film (UPILEX (registered trademark)-S (manufactured by UBE INDUSTRIES, LTD., thickness: 70 µm)) through a metal mask. As the metal mask, a mask in which 1,785 openings each having a size of 0.5 mm×1.5 mm were arranged in a 6 cm×6 cm area (36 cm$^2$) was used, and the printing was performed under the conditions of an attack angle of 20°, a snap-off distance of 1.5 mm, a print pressure of 0.3 MPa, and an squeegee downstop of 1.0 mm. Thereafter, the film was dried on a hot plate for 30 minutes at 50° C. and then for 2.5 hours at 120° C., thereby obtaining printing patterns.

<Evaluation of Printing Size>

From the obtained printing patterns, 10 printed articles were randomly extracted, and the printing size thereof was measured using a laser microscope (manufactured by KEYENCE CORPORATION). The obtained printing sizes of the 10 printed articles were categorized based on the following criteria a and b and then evaluated according to the following criteria A to C.

a: The printing size was not more than 1.2 times the opening size of the metal mask.

b: The printing size was greater than 1.2 times the opening size of the metal mask.

A: All of the 10 printed articles corresponded to the criterion a.

B: Nine to six out of the 10 printed articles corresponded to the criterion a.

C: Five or less printed articles corresponded to the criterion a.

[Preparation of Thermoelectric Conversion Module]

By the following method, the thermoelectric conversion module shown in FIGS. 3A to 3D was prepared.

An adhesive-free copper-clad polyimide substrate (FELIOS R-F775, manufactured by Panasonic Electric Works Co., Ltd.) was prepared. The copper-clad polyimide substrate has a size of 110×80 mm; the thickness of the polyimide layer is 25 µm; and the thickness of the Cu layer is 70 µm.

By etching the copper layer of the copper-clad polyimide substrate, copper stripe patterns having a width of 0.5 mm and an interval of 0.5 mm were formed. Thereby, a first substrate and a second substrate were prepared in each of which belt-like high thermal conduction portions having a thickness of 70 µm and a width of 0.5 mm were arranged at an interval of 0.5 mm in a direction orthogonal to the extension direction of the belt on the surface of sheet-like low thermal conduction portion having a thickness of 25 µm.

Thereafter, by a vacuum vapor deposition method using a metal mask, films of Cr, Ni, and Ag were formed in this order on the surface (planar surface), which was solely composed of the polyimide layer, of the first substrate, thereby forming electrodes composed of 3 layers of a Cr electrode, a Ni electrode, and a Ag electrode. The Cr electrode had a thickness of 50 nm, the Ni electrode had a thickness of 1 µm, and the Ag electrode had a thickness of 200 nm. The Cr electrode mainly functions as an adhesion layer between the first substrate and the electrodes. Furthermore, the Ag electrode was formed only in the vicinity of the end portion covered with the thermoelectric conversion layer which will be formed later.

By using the printing composition of Example 20, on the surface (planar surface), which was solely composed of the polyimide layer and on which the electrodes were vapor-deposited, of the first substrate, 1,785 patterns of the printing composition having a size of 0.6×1.5 mm were formed at an interval of 0.5 mm along the extension direction of the high thermal conduction portions and at an interval of 0.5 mm along the arrangement direction of the high thermal conduction portions. The patterns were dried for 30 minutes at 50° C. and then for 30 minutes at 120° C. The patterns of the printing composition were formed by metal mask printing under the conditions of an attack angle of 20°, a clearance of 1.0 mm, a printing pressure of 0.3 MPa, and an indentation of 0.5 mm by taking the series connection direction of the thermoelectric conversion elements as a squeegee direction.

Thereafter, by dipping the first substrate into ethanol for 4 minutes, sodium deoxycholate was removed, and the first substrate was dried for 30 minutes at 50° C. and then for 150 minutes at 120° C., thereby forming 1,785 thermoelectric conversion layers on the first substrate with electrodes. The thickness of each of the thermoelectric conversion layers 16 was 5.0 µm. In order to check the printing yield, by the same method described above, 10 sheets of the first substrate with electrodes on which 1,785 thermoelectric conversion layers were formed were prepared.

Then, as a pressure sensitive adhesive layer, a double-sided tape having a thickness of 5 µm (No. 5600 manufactured by NITTO DENKO CORPORATION) was stuck to the surface (planar surface), which was solely composed of the polyimide layer, of the second substrate.

In a state where the surface, on which the thermoelectric conversion layers and the electrodes were formed, of the first substrate was caused to face up, the second substrate stuck and bonded to the double-sided tape was stuck to the surface such that the entire surface was covered. Herein, the second substrate was stuck to the first substrate 12A, such that the extension direction of the high thermal conduction portions coincided with that of the high thermal conduction portions of the first substrate; the end lines of the high thermal conduction portions and the low thermal conduction portions coincided with each other; and the high thermal conduction portion and that of the first substrate 12A alternated with each other and the low thermal conduction portion and that of the first substrate 12A alternated with each other. As a result, a thermoelectric conversion module in which 1,785 thermoelectric conversion elements were connected to each other in series was prepared.

Subsequently, by using the printing compositions of Examples 20 to 35, thermoelectric conversion modules were prepared in the same manner as described above.

Comparative Example 4

By using the printing composition of Example 20, a thermoelectric conversion module was prepared in the same manner as in Example 20, except that the unwashed thermoelectric conversion layers were directly used as thermoelectric conversion layers without being washed with ethanol. The film thickness of each of the thermoelectric conversion layers was 10 μm.

<Evaluation of Printing Yield>

For the ten sheets of the first substrates with electrodes on which 1,785 thermoelectric conversion layers were formed, the resistance was measured using a tester, and the variation in the resistance was evaluated based on the following criteria.

A: The standard deviation was equal to or less than 0.3.
B: The standard deviation was greater than 0.3 and equal to or less than 0.6.
C: The standard deviation was greater than 0.6.

The smaller the standard deviation, the smaller the variation in the resistance, and the higher the printing yield.

<Mass Ratio of "CNT/Surfactant" in Upper Layer Portion 16$u$ and Lower Layer Portion 16$b$>

For the prepared first substrate with electrodes, by time-of-flight secondary ion mass spectrometry (TOF-SIMS), the mass ratio of "CNT/surfactant" in the upper layer portion 16$u$ and the lower layer portion 16$b$ was calculated.

The evaluation criteria are as below.

A: The mass ratio of "CNT/surfactant" expressed as "upper layer portion 16$u$/lower layer portion 16$b$" was greater than 1.
B: The mass ratio of "CNT/surfactant" expressed as "upper layer portion 16$u$/lower layer portion 16$b$" was equal to or less than 1.

<Adhesiveness>

By using the obtained first substrate with electrodes, the adhesiveness was evaluated according to the same procedure as in Examples 1 to 15 and Comparative examples 1 to 3.

<Resistance>

For each of the thermoelectric conversion modules, the value of resistance was measured using a tester. The value of resistance was standardized by regarding the value of resistance of the thermoelectric conversion module of Comparative example 4 as 1. The evaluation criteria are as below.

A: The value of resistance was smaller than 0.05.
B: The value of resistance was smaller than 0.5 and equal to or greater than 0.05.
C: The value of resistance was equal to or greater than 0.5.

<Output>

Each of the thermoelectric conversion modules, the first substrate 12 side down, was placed on a hot plate, and a Peltier element for temperature control was installed on the second substrate 20.

In a state where the temperature of the hot plate was kept at 100° C., the temperature of the Pelitier element was reduced, such that a temperature difference of 10° C. was caused between the first substrate 12 and the second substrate 20 of the thermoelectric conversion module.

In this state, current-voltage characteristics were measured using a SourceMeter (manufactured by Keithley Instruments Inc.), and a short circuit current and an open circuit voltage were measured. From the measurement results, output was calculated by "output=current×voltage/4". The output was standardized by regarding the output of the thermoelectric conversion module of Comparative example 4 as 1. The evaluation criteria are as below.

A: The output was greater than 120.
B: The output was greater than 50 and equal to or less than 120.
C: The output was equal to or less than 50.

The results are shown in the following Table 2.

TABLE 2

| | CNT concentration/wt % | Dispersant Type[b] | Dispersant Mass ratio[c] | Rheological modifier Type | Rheological modifier Concentration with respect to water/wt % | Rheological modifier Amount with respect to CNT/wt % | Thermoelectric conversion layer Film thickness/μm | Thermoelectric conversion layer Upper layer/Lower layer | Evaluation Printing size | Evaluation Printing yield | Evaluation Adhesiveness | Evaluation Resistance | Evaluation Output |
|---|---|---|---|---|---|---|---|---|---|---|---|---|---|
| Example 20 | 2.5 | A | 3 | Tetrafluoro-tetracyano-quinodimethane | 1.25 | 50 | 3.6 | A | A | A | A | A | A |
| Example 21 | 2.5 | A | 3 | Tetrafluoro-tetracyano-quinodimethane | 0.875 | 35 | 4.1 | A | A | A | A | A | A |
| Example 22 | 2.5 | A | 3 | 2,3,5,6-tetramethyl tetracyano-quinodimethane | 2.5 | 100 | 4.1 | A | A | A | A | A | B |
| Example 23 | 2.5 | A | 3 | 2,5-difluro-7,7,8,8-tetracyano-quinodimethane | 1.5 | 60 | 3.3 | A | A | A | A | A | B |
| Example 24 | 2.5 | A | 3 | 2,3-dichloro-5,6-dicyano-p-benzoquinone | 0.625 | 25 | 3.9 | A | A | A | A | A | A |

TABLE 2-continued

| | CNT concen-tration/ wt % | Dispersant Type[b] | Dispersant Mass ratio[c] | Rheological modifier Type | Rheological modifier Concentration with respect to water/wt % | Amount with respect to CNT/ wt % | Thermoelectric conversion layer Film thickness/ μm | Thermoelectric conversion layer Upper layer/ Lower layer | Evaluation Printing size | Evaluation Printing yield | Evaluation Adhesiveness | Evaluation Resistance | Evaluation Output |
|---|---|---|---|---|---|---|---|---|---|---|---|---|---|
| Example 25 | 2.5 | A | 3 | Tetracyano-quinodimethane | 1.25 | 50 | 3.9 | A | B | B | A | A | A |
| Example 26 | 3 | A | 5 | Tetracyano-quinodimethane | 1.25 | 50 | 5.1 | A | B | B | A | A | A |
| Example 27 | 2.5 | A | 3 | 2,5-dimethyl-7,7,8,8-tetracyano quinodimethane | 2.5 | 100 | 4.1 | A | B | B | A | A | B |
| Example 28 | 2.5 | A | 3 | Tetrafluoro-1,4-benzoquinone | 1.875 | 75 | 3.7 | A | B | B | A | A | B |
| Example 29 | 2.5 | A | 3 | Carboxymethyl-cellulose sodium salt | 0.625 | 25 | 3.8 | A | A | A | A | A | A |
| Example 30 | 1.25 | A | 2 | Carboxymethyl cellulose sodium salt | 0.9375 | 75 | 2.1 | A | A | A | A | A | A |
| Example 31 | 2.5 | A | 3 | Xanthan gum | 0.313 | 12.5 | 3.5 | A | A | A | A | A | A |
| Example 32 | 2.5 | B | 3 | Carboxymethyl cellulose sodium salt | 0.625 | 25 | 4 | A | A | A | A | A | A |
| Example 33 | 2.5 | A | 3 | Gelatin | 0.625 | 25 | 3.9 | A | B | B | A | A | B |
| Example 34 | 2.5 | A | 3 | Sodium polyacrylate | 0.025 | 1 | 4.7 | A | A | A | A | A | A |
| Example 35 | 2.5 | A | 3 | Carboxymethyl cellulose sodium salt | 0.625 | 25 | 3.8 | A | A | A | A | A | A |
| Comparative example 4 | 2.5 | A | 3 | Tetrafluoro-tetracyano-quinodimethane | 1.25 | 50 | 10 | B | A | A | A | C | C | a) Mass concentration of carbon nanotubes with respect to water
b) A = sodium deoxycholate, B = sodium cholate
c) Mass of dispersant/mass of CNT As shown in the above Table 2, even in a case where the rheological modifier was used, in all of the thermoelectric conversion modules of the present invention in which the mass ratio of "CNT/surfactant" satisfied "upper layer portion 16u>lower layer portion 16b", all of the adhesiveness between the first substrate 12A and the thermoelectric conversion layers 16, an excellent value of resistance of the thermoelectric conversion layers 16, and excellent thermoelectric conversion performance were accomplished.

EXPLANATION OF REFERENCES

10: Thermoelectric conversion element
12, 12A: First substrate
12a, 20a: Low thermal conduction portion
12b, 20b: High thermal conduction portion
16: Thermoelectric conversion layer
18: Pressure sensitive adhesive layer
20, 20A: Second substrate
26, 28: Electrode

What is claimed is:

1. A thermoelectric conversion element comprising:
   a first substrate;
   a thermoelectric conversion layer which contains carbon nanotubes and a surfactant and is formed on a surface of the first substrate; and
   an electrode pair disposed along a plane direction of the first substrate such that the thermoelectric conversion layer is interposed between the electrode pair,
   wherein the surface, on which the thermoelectric conversion layer is formed, of the first substrate has a surface energy of equal to or greater than 20 mN/m, and
   provided that a region which occupies 50% of the film thickness of the thermoelectric conversion layer on a first substrate side in the thickness direction of the thermoelectric conversion layer is a lower layer portion, a region other than the lower layer portion in the thickness direction of the thermoelectric conversion layer is an upper layer portion, a region which occupies 20% of an end portion side of the thermoelectric conversion layer in the substrate plane direction of the first substrate is an end region, and a region other than the end region in the substrate plane direction of the first substrate is a central region, a mass ratio, which is obtained by dividing the mass of the carbon nanotubes by the mass of the surfactant, satisfies at least one of "upper layer portion>lower layer portion" or "end region>central region" in the thermoelectric conversion layer.

2. The thermoelectric conversion element according to claim 1, further comprising:
   a pressure sensitive adhesive layer on the thermoelectric conversion layer; and
   a second substrate on the pressure sensitive adhesive layer.

3. The thermoelectric conversion element according to claim 2, wherein the first substrate has a high thermal conduction portion, which has higher thermal conductivity compared to a remaining portion, in at least a portion in the plane direction, the second substrate has a high thermal conduction portion, which has higher thermal conductivity compared to a remaining portion, in at least a portion in the plane direction, and the high thermal conduction portion of the second substrate does not completely overlap the high thermal conduction portion of the first substrate in the plane direction.

4. The thermoelectric conversion element according to claim 1, wherein the thermoelectric conversion layer has a thickness of equal to or greater than 1 μm.

5. The thermoelectric conversion element according to claim 1, wherein the surfactant is an ionic surfactant.

6. The thermoelectric conversion element according to claim 1, further comprising:

a rheological modifier contained in the thermoelectric conversion layer.

7. The thermoelectric conversion element according to claim 6, wherein the rheological modifier has a redox potential of equal to or greater than −0.1 V with respect to a saturated calomel reference electrode.

8. A thermoelectric conversion module comprising a plurality of the thermoelectric conversion elements according to claim 1.

9. The thermoelectric conversion module according to claim 8, wherein a plurality of the thermoelectric conversion layers is regularly arranged on the first substrate and connected to each other through electrodes which become the electrode pair.

* * * * *